United States Patent
Vangara et al.

(10) Patent No.: US 11,936,371 B1
(45) Date of Patent: Mar. 19, 2024

(54) ACCURATE REDUCED GATE-DRIVE CURRENT LIMITER

(71) Applicant: pSemi Corporation, San Diego, CA (US)

(72) Inventors: Satish Kumar Vangara, Woodley (GB); Antony Christopher Routledge, Basingstoke (GB); Gregory Szczeszynski, Nashua, NH (US); Xiaowu Sun, Milford, NH (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/959,904

(22) Filed: Oct. 4, 2022

(51) Int. Cl.
  *H03K 17/08* (2006.01)
  *H03K 5/08* (2006.01)
  *H03K 17/082* (2006.01)

(52) U.S. Cl.
  CPC ......... *H03K 17/0822* (2013.01); *H03K 5/086* (2013.01)

(58) Field of Classification Search
  CPC .............. H03K 17/06; H03K 17/063; H03K 2017/066; H03K 17/08; H03K 17/082;
  (Continued)

(56) References Cited

U.S. PATENT DOCUMENTS

| 4,835,649 A | 5/1989 | Salerno |
|---|---|---|
| 8,049,551 B2 | 11/2011 | Kotowski et al. |

(Continued)

FOREIGN PATENT DOCUMENTS

| CN | 101976555 | 2/2013 |
|---|---|---|
| CN | 112821886 | 5/2021 |

(Continued)

OTHER PUBLICATIONS

Retebo, Metasebia, Office Action received from the USPTO dated May 6, 2022 for U.S. Appl. No. 17/331,594, 21 pgs.

(Continued)

*Primary Examiner* — Long Nguyen
(74) *Attorney, Agent, or Firm* — JAQUEZ LAND GREENHAUS & McFARLAND LLP; John Land, Esq.

(57) ABSTRACT

Circuits and methods that limit current through power FETs of power converter to reduce damaging current in-rush events, independent of switching frequency, device mismatches, and PVT variations. Embodiments utilize a closed-loop feedback circuit and/or a calibrated compensation circuit to regulate, substantially independent of frequency, the control voltage $V_{GATE}$ applied to a power FET gate. In a reduced gate-drive mode, connecting a feedback or compensation circuit to the gate of an LDO source-follower FET allows the gate voltage to be regulated to control the LDO output voltage to a final inverter coupled to the gate of a power FET so that $V_{GATE}$ is adjusted to provide a reduced gate-drive to the power FET; connecting to the output of the LDO allows the LDO output voltage to the final inverter to be directly regulated to adjust $V_{GATE}$; connecting to the gate of the power FET allows $V_{GATE}$ to be directly set.

18 Claims, 18 Drawing Sheets

(58) Field of Classification Search
CPC ...... H03K 17/10; H03K 17/102; H03K 17/12; H03K 17/122; H03K 17/687; H03K 5/08; H03K 17/086; H02M 3/07; H02M 1/08
See application file for complete search history.

(56) References Cited

U.S. PATENT DOCUMENTS

| | | |
|---|---|---|
| 9,203,299 B2 | 12/2015 | Low et al. |
| 10,263,514 B1 | 4/2019 | Aboueldahab |
| 10,680,512 B2 | 6/2020 | Babazadeh et al. |
| 10,749,429 B2 | 8/2020 | Harvey |
| 2009/0174485 A1 | 7/2009 | Teng et al. |
| 2018/0269789 A1 | 9/2018 | Kondo et al. |
| 2022/0385178 A1* | 12/2022 | Routledge ............ H03K 17/687 |
| 2022/0393586 A1* | 12/2022 | Yamakoshi ......... H03F 3/45475 |

FOREIGN PATENT DOCUMENTS

| | | |
|---|---|---|
| JP | 2007173493 | 7/2007 |
| WO | 2017115630 | 7/2017 |

OTHER PUBLICATIONS

Retebo, Metasebia, Final Office Action received from the USPTO dated Dec. 14, 2022 for U.S. Appl. No. 17/331,594, 13 pgs.

Retebo, Metasebia, Office Action received from the USPTO dated Apr. 27, 2023 for U.S. Appl. No. 17/331,594, 7 pgs.

Lee, Kang Ha, International Search Report and Written Opinion received from KIPO dated Jan. 29, 2024 for appln. No. PCT/US2023/075790, 12 pgs.

* cited by examiner

(200 kHz)

(1 MHz)

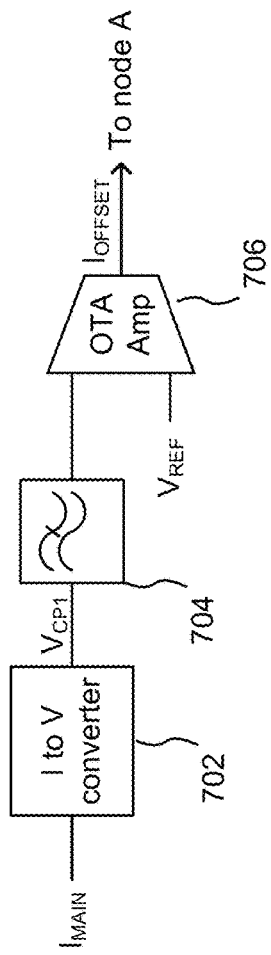
FIG. 7A
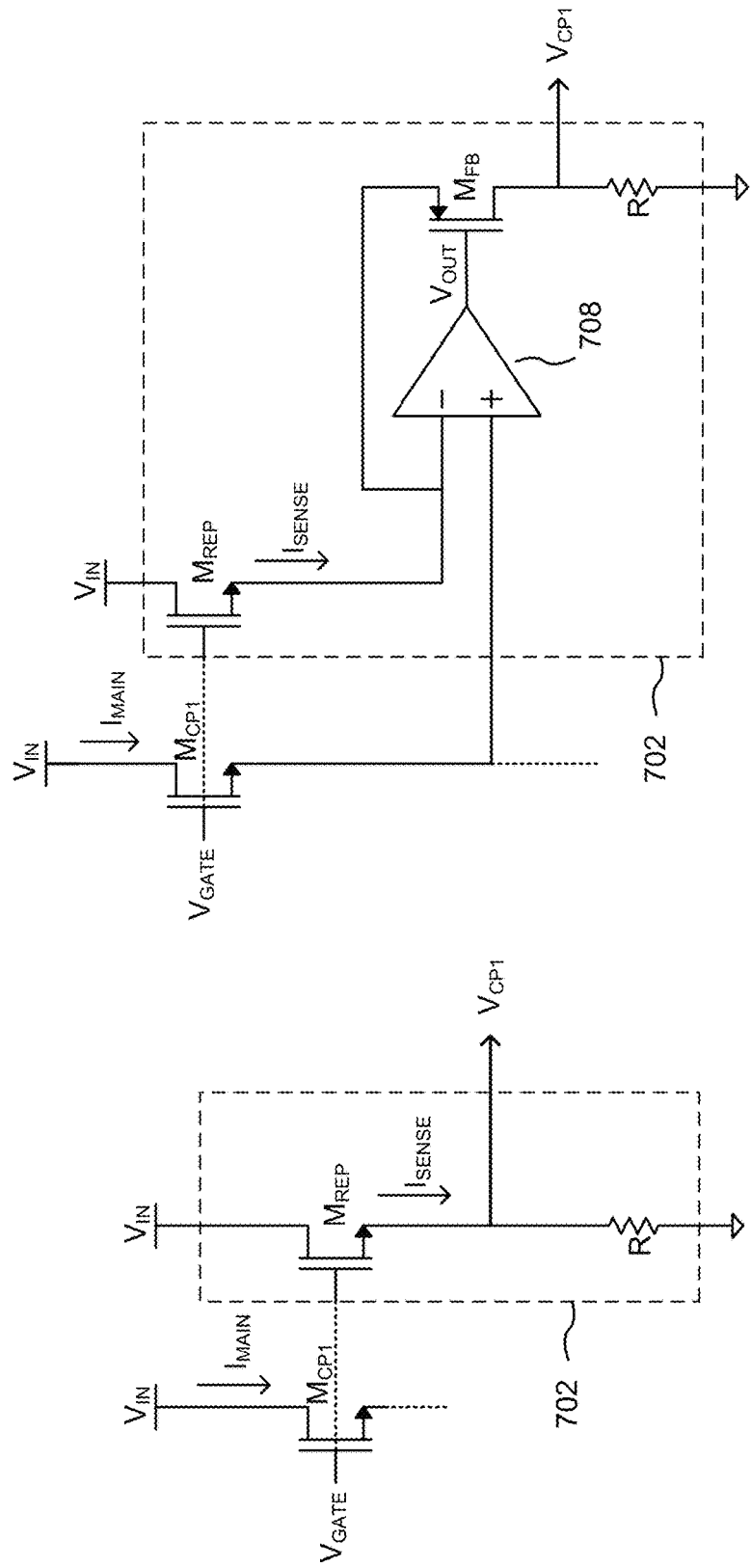
FIG. 7C
FIG. 7B

*1600*

```
┌─────────────────────────────────────┐
│ Controlling the ON resistance, R_ON, of a power │
│ FET in the power converter to lower the R_ON of │
│ the power FET in a first ON state during normal │── 1602
│ power converter operation and to raise the R_ON │
│ of the power FET in a second ON state to        │
│ restrict flow of current through the power FET  │
└─────────────────────────────────────┘
                    │
                    ▼
┌─────────────────────────────────────┐
│ Applying a compensation voltage boost to a      │
│ gate of the power FET in the second ON state    │
│ to increase a drive voltage to the gate to      │── 1604
│ compensate for a gate capacitance of the        │
│ power FET                                       │
└─────────────────────────────────────┘
```

FIG. 16

ACCURATE REDUCED GATE-DRIVE CURRENT LIMITER

CROSS-REFERENCE TO RELATED APPLICATIONS

This invention may be related to the U.S. patent application Ser. No. 17/331,594, filed May 26, 2021, entitled "Dynamic Division Ratio Charge Pump Switching", assigned to the assignee of the present invention, the contents of which are incorporated by reference.

BACKGROUND

(1) Technical Field

This invention relates to electronic circuits, and more particularly to power converter circuits, including DC-DC converter circuits, and current limiting circuits for such converter circuits.

(2) Background

Many electronic products, particularly mobile computing and/or communication products and components (e.g., notebook computers, ultra-book computers, tablet devices, LCD and LED displays) require multiple voltage levels. For example, radio frequency (RF) transmitter power amplifiers may require relatively high voltages (e.g., 12V or more), whereas logic circuitry may require a low voltage level (e.g., 1-2V). Still other circuitry may require an intermediate voltage level (e.g., 5-10V).

Power converters are often used to generate a lower or higher voltage from a common power source, such as a battery. One type of power converter comprises a converter circuit (e.g., a charge pump based on a switch-capacitor network), control circuitry, and, in some embodiments, auxiliary circuitry such as bias voltage generator(s), a clock generator, a voltage regulator, a voltage control circuit, etc. As used in this disclosure, the term "charge pump" refers to a switched-capacitor network configured to boost or buck $V_{IN}$ to $V_{OUT}$. Examples of such charge pumps include cascade multiplier, Dickson, Ladder, Series-Parallel, Fibonacci, and Doubler switched-capacitor networks, all of which may be configured as a multi-phase or a single-phase network. Switched-capacitor network DC-DC converters are generally integrated circuits (ICs) that may have some external components (such as capacitors) and in most cases are characterized as having a fixed $V_{IN}$ to $V_{OUT}$ conversion ratio (e.g., division by 2 or by 3). An AC-DC power converter can be built up from a DC-DC power converter by, for example, first rectifying an AC input to a DC voltage and then applying the DC voltage to a DC-DC power converter.

To provide greater flexibility to system designers, and to deal with applications where a power source may change that requires different conversion ratios (e.g., as a battery discharges and outputs a lower voltage, or when the power source to a device is switched between a battery and an AC-DC power line source), it is useful to utilize a DC-DC power converter having a selectable conversion ratio. For example, U.S. Pat. No. 10,263,514 B1, issued Apr. 16, 2019, entitled "Selectable Conversion Ratio DC-DC Converter", assigned to the assignee of the present invention and hereby incorporated by this reference, describes a Dickson DC-DC power converter that may be switched between a divide-by-2 mode of operation and a divide-by-3 mode of operation. As another example, U.S. Pat. No. 9,203,299 B2, issued Dec. 1, 2015, entitled "Controller-Driven Reconfiguration of Switched-Capacitor Power Converter", now assigned to the assignee of the present invention and hereby incorporated by this reference, describes other DC-DC power converter architectures having reconfigurable conversion ratios.

A general problem with many FET-based DC-DC power converter architectures is that excessive current in-rush needs to be avoided during startup of the power converter. For example, for a selectable conversion ratio DC-DC converter of the type shown in U.S. Pat. No. 10,263,514 B1, absent sufficient guard circuitry, when an input voltage $V_{IN}$ is first applied, none of the capacitors (sometimes known as "fly capacitors") would be charged initially and accordingly current rushes into the circuit. For example, if the ON resistance, $R_{ON}$, of the FET power switches is 1 milliohm (0.001 ohms), and $V_{IN}$ is 10V, then as a result of Ohm's law, V=I×R, the in-rush current spikes at about 10,000 amps. In integrated circuit implementations, parasitic inductances exist (for example, due to on-die conductor routing and printed circuit board conductor routing) which transform a current spike to a voltage spike in accordance with inductor theory: V=L×dI/dt. Such voltage spikes electrically overstress the charge pump power switches, affecting their reliability, potentially to destruction. For a 1 ns 100 A pulse to generate 10V across the charge pump power switches, the parasitic inductance need only be about 100 pH. The resulting 10V spike may exceed the breakdown voltage of many of the FET switches, and of course, a larger current spike results in a larger voltage spike for the same parasitic inductance.

A related problem occurs when the fly capacitors of a DC-DC power converter are out of balance, meaning that a charge difference exists between fly capacitors connected by power switches. If charge balance is not maintained, current spikes and resulting damaging voltage spikes can occur.

Accordingly, it would be useful to be able to mitigate or eliminate what may be characterized as "potentially damaging events" in power converters (e.g., damaging current spikes that may occur for a variety of reasons, including in-rush current, charge transfer current, short circuits, EMI events, and the like).

SUMMARY

The present invention provides circuits and methods that limit current through power FETs of power converters, thereby mitigating or eliminating potentially damaging events, independent of converter switching frequency, device mismatches, and process, voltage, and temperature (PVT) variations. Such circuits and methods provide protection against potentially damaging events such as current spikes during a "soft-start" for power converters and during dynamic charge balancing, without requiring added circuitry directed to those functions.

Embodiments of the present invention may some or all of the following advantages: a current limiting value that is independent of a power converter switching frequency, device mismatches and process, voltage, and/or temperature (PVT) variations; accurate soft-start current limiting; reliable operation of power FETs in power converters having reconfigurable conversion ratios when dynamically changing conversion ratios; and the ability to keep a level output voltage when a power converter operates at full load in different operating and PVT conditions.

In contrast to open-loop implementations of an LDO power supply, embodiments of the present invention utilize an added closed-loop feedback circuit and/or an added calibrated compensation circuit to closely control the control voltage $V_{GATE}$ applied to the gate of a power FET in a manner that is substantially independent of frequency. Depending on the nature of the added circuit, connection to the LDO power supply may be made at one of several nodes. Connecting a feedback or compensation circuit to the gate of an LDO source-follower FET allows the gate voltage of the source-follower FET to be regulated to control the LDO output voltage to a final inverter coupled to the gate of a power FET so that $V_{GATE}$ is adjusted to provide a reduced gate-drive to the power FET. Connecting a feedback or compensation circuit at the output of the LDO power supply allows the LDO output voltage to the final inverter to be directly regulated so that $V_{GATE}$ is adjusted to provide a reduced gate-drive to the power FET. Connecting a feedback or compensation circuit to the gate of the power FET allows $V_{GATE}$ to be directly set to provide a reduced gate-drive to the power FET.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 7A is a block diagram of an example circuit for generating the supplemental feedback offset current $I_{OFFSET}$.

FIG. 7B is a schematic diagram of a first example embodiment of a current-to-voltage converter.

FIG. 7C is a schematic diagram of a second example embodiment of a current-to-voltage converter.

FIG. 16 is a process flow chart showing a second method for protecting a power converter.

Like reference numbers and designations in the various drawings indicate like elements.

DETAILED DESCRIPTION

The present invention provides circuits and methods that limit current through power FETs of power converters, thereby mitigating or eliminating potentially damaging events, independent of converter switching frequency, device mismatches, and process, voltage, and temperature (PVT) variations. Such circuits and methods provide protection against potentially damaging events such as current spikes during a "soft-start" for power converters and during dynamic charge balancing, without requiring added circuitry directed to those functions.

Example Selectable Conversion Ratio Power Converter

Figure 1:
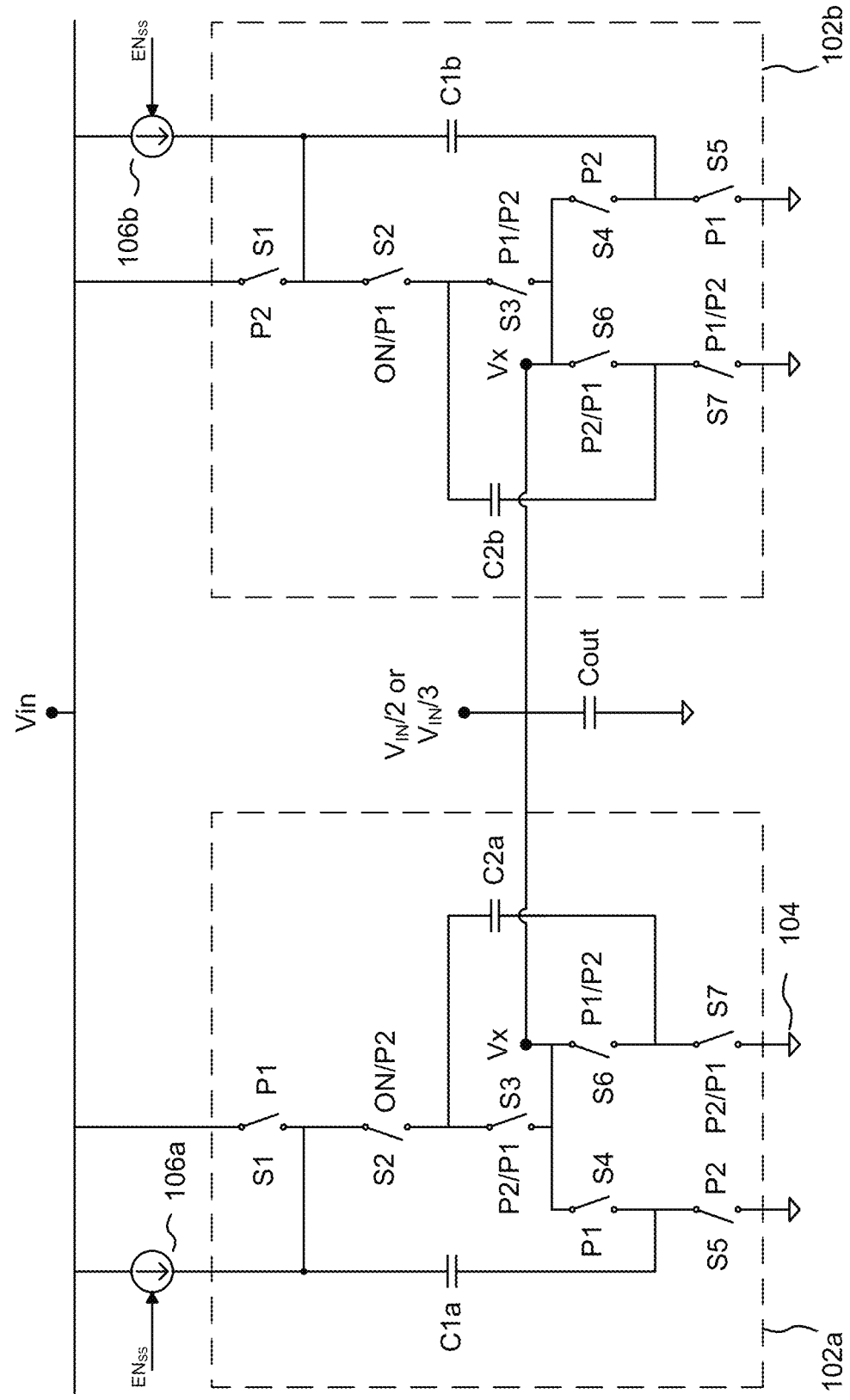
FIG. 1 is a block diagram of one embodiment of a DC-DC selectable conversion ratio power converter.

FIG. 1 is a block diagram of one embodiment of a DC-DC selectable conversion ratio power converter 100. The specific illustrated power converter 100 may be selectably configured to be either a divide-by-2 Dickson converter or a divide-by-3 Dickson converter using the same basic circuit. The same power converter 100 may be used for DC-to-DC boost conversion by reversing the voltage input and voltage output. The illustrated power converter 100 includes two parallel sections 102a, 102b that are coupled between a voltage source $V_{IN}$ and a reference potential 104 such as circuit ground. Each section 102a, 102b includes 3 series-connected switches S1-S3 coupled in series to a first branch comprising 2 series-connected switches S4-S5, and to a second branch comprising 2 series-connected switches S6-S7. Each switch may comprise, for example, one or more FETs, including one or more MOSFETs.

In each section 102a, 102b, coupled between a first upper pair of switches S1, S2 and a first branch pair of switches S4, S5 is a first capacitor C1a, C1b, and coupled between a second upper pair of switches S2, S3 and a second branch pair of switches S6, S7 is a second capacitor C2a, C2b. Depending on the output ratio configuration (divide-by-2 or divide-by-3), each section 102a, 102b generates an output voltage at a node $V_X$ that is coupled to an output capacitor $C_{OUT}$.

At least some of the switches S1-S7 may be selectively controlled to be in an ON (conductive) or OFF (blocking) state by control circuitry (not shown). At least some of the switches S1-S7 may be selectively coupled to one of two non-overlapping complementary clock phases, P1 or P2.

Some of the switches S1-S7 may be permanently coupled to one of the two complementary clock phases, P1 or P2. TABLE 1 below shows the configuration of the state or associated clock phase for each of the switches S1-S7 of the two parallel sections 102a, 102b for both a divide-by-2 configuration and a divide-by-3 configuration.

TABLE 1

| Divide-by-2 Configuration | | Divide-by-3 Configuration | |
|---|---|---|---|
| Section 102a | Section 102b | Section 102a | Section 102b |
| S1 = P1 | S1 = P2 | S1 = P1 | S1 = P2 |
| S2 = ON | S2 = ON | S2 = P2 | S2 = P1 |
| S3 = P2 | S3 = P1 | S3 = P1 | S3 = P2 |
| S4 = P1 | S4 = P2 | S4 = P1 | S4 = P2 |
| S5 = P2 | S5 = P1 | S5 = P2 | S5 = P1 |
| S6 = P1 | S6 = P2 | S6 = P2 | S6 = P1 |
| S7 = P2 | S7 = P1 | S7 = P1 | S7 = P2 |

Note that the clock phase associations for section 102b are the complements of the clock phase associations for section 102a. The complementary phasing of the two parallel sections 102a, 102b provides output ripple smoothing and additional current capacity. Additional sections may be included to provide even more current capacity. Complimentary pairs of additional sections may be controlled by clock signal phases that are 180° apart and that have a different phase than P1 or P2 to provide even more output ripple smoothing (e.g., 45° or 60°—or multiples of those values—out of phase with respect to P1 and P2).

Figure 2:
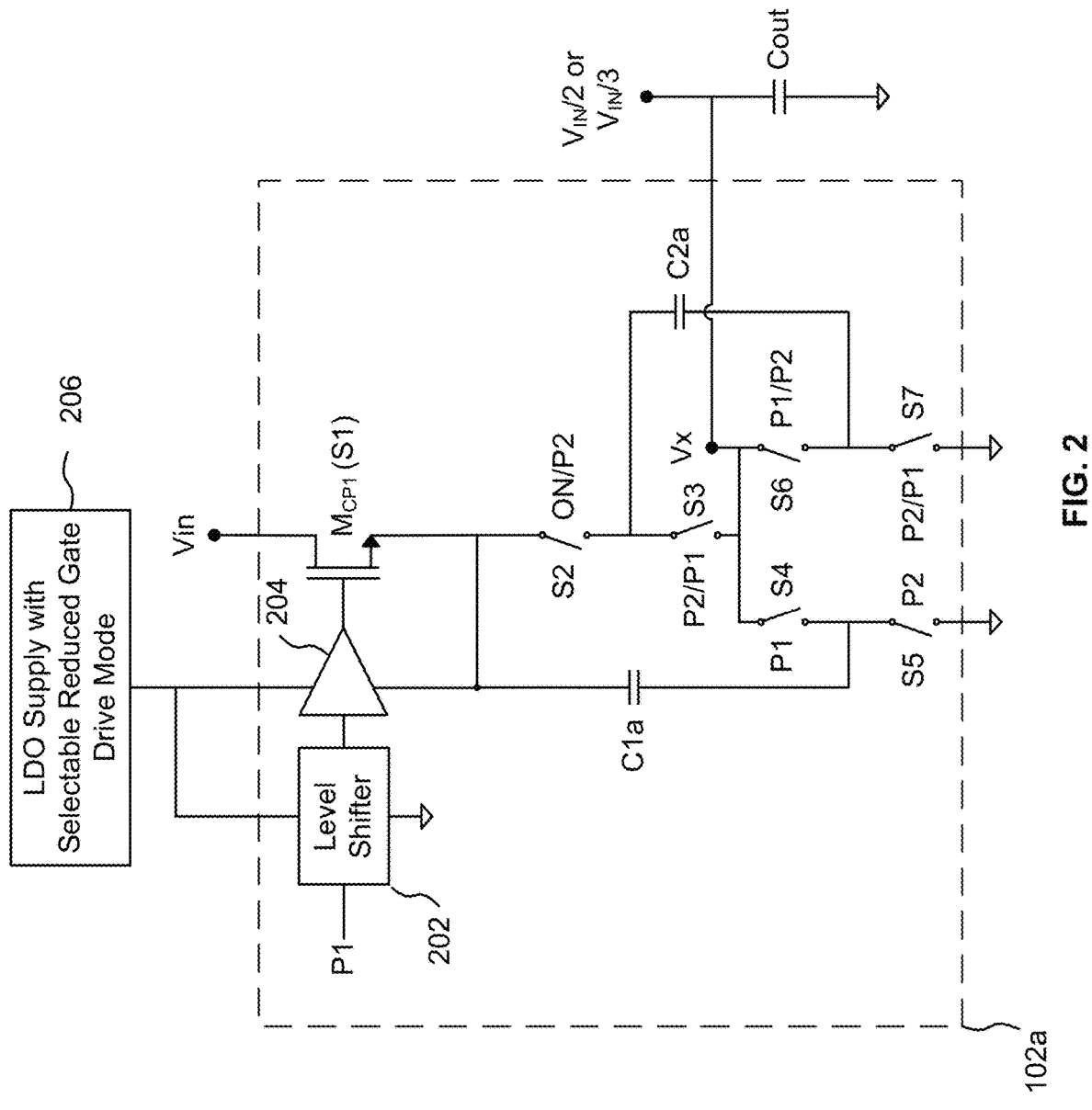
FIG. 2 is a block diagram of one section of a power converter showing implementation details for the primary switch of one section.

In a FET-based implementation, ON/OFF control signals or clock phase signals are coupled to the gate of each switch S1-S7 through at least a driver circuit, and in many cases through both a level shifter circuit and a driver circuit (see FIG. 2 for more details).

In either configuration, the non-overlapping complementary clock signals P1, P2 open or close associated power switches, causing charge to be transferred from the fly capacitors C1a, C1b, C2a, C2b into $C_{OUT}$, resulting in a voltage across $C_{OUT}$ of $V_{IN}/X$, where X=2 or 3. Further details of the operation of this and similar DC-DC selectable conversion ratio power converters are set forth in U.S. Pat. No. 10,263,514 B1.

Limiting In-Rush Current During Soft-Starts

As noted above, damaging current spikes in power converters may occur for a variety of reasons, including in-rush current, charge transfer current, short circuits, and the like. For example, with respect to DC-DC power converters having selectable conversion ratios, switching from one conversion ratio (e.g., divide-by-2, or "DIV2") to another conversion ratio (e.g., divide-by-3, or "DIV3") may result in a charge imbalance across the fly capacitors, resulting in potentially damaging in-rush currents. Accordingly, a common practice for avoiding potentially damaging events has been to switch the DC-DC power converter OFF, allow the fly capacitors to discharge, change the conversion ratio configuration (e.g., by changing clock phasing to the switches S1-S7 as needed), and turn the power back ON, relying on conventional startup circuitry to mitigate in-rush current spikes. A disadvantage of this practice is that the process can take several milliseconds to complete and cannot be completed under load.

One aspect of the present invention encompasses circuits and method for mitigating or eliminating potentially damaging events if they occur or are to occur (e.g., are known in advance, as when a conversion ratio is to be dynamically changed). Mitigating or eliminating potentially damaging events enables switching selectable conversion ratios DC-DC power converters from one conversion ratio to another conversion ratio under load without turning off the power converter circuitry or suspending switching of the charge pump power switches.

As described in U.S. patent application Ser. No. 17/331,594, it is desirable, and often necessary, to limit the current drawn by a power converter from an input supply during startup to avoid high in-rush currents, particularly when dynamically changing the conversion ratio of the power converter. Referring to FIG. 1, a conceptual solution during a "soft-start" period before steady-state operation of the power converter 100 is to enable current sources 106a, 106b, respectively coupled to the sections 102a, 102b, and operate the switches S1-S7 so as to allow the fly capacitors C1a, C1b, C2a, C2b to be charged by the current sources 106a, 106b to a sufficient state to prevent current spikes. More specifically, the current sources 106a, 106b may be coupled between $V_{IN}$ and a node between switches S1 and S2 that also couples to a respective fly capacitor C1a, C1b. Closing switch S2 during the soft-start period also couples the current sources 106a, 106b to a respective fly capacitor C2a, C2b.

One way to implement the current sources 106a, 106b is by means of a power switch coupled in series with a resistor between $V_{IN}$ and the node between switches S1 and S2 (the power switch and resistor are thus coupled in parallel with switch S1). Closing the power switch creates a high resistive path during the soft-start period to limit the start-up current. Once the power converter output voltage \Tour nears its regulated value, the power switch is opened. However, such an implementation requires a very large FET for the power switch in order to withstand the voltage and current at startup, and thus requires a large amount of integrated circuit (IC) die area (as much as about 25% in some embodiments).

In U.S. patent application Ser. No. 17/331,594, it was realized that switch S1 and its driver circuitry could be adapted to perform the functions of the current sources 106a, 106b, thus eliminating the need for additional large power switches and resistors. In particular, it was realized that the power converter switches S1-S7 are normally operated in an "over-driven" or "full drive" condition when set to an ON (conducting) state. An overdriven FET gate creates a stronger conduction channel, effectively lowering the ON resistance, Rory, of the FET. With that insight, it was further realized that increasing Rory for some or all of the power FETs in a power converter (especially switch S1) during potentially damaging events (e.g., during startup or when dynamically reconfiguring the conversion ratio of the power converter) would reduce current flow through the FETs and thus protect against excessive current spikes.

FIG. 2 is a block diagram of one section 102a of a power converter 200 showing implementation details for the primary switch of one section. While section 102a is shown, a similar configuration exists for section 102b. In the illustrated example, switch S1 is implemented as a FET $M_{CP1}$. A clock phase (P1 in this example) is coupled through a level shifter 202 to the input of a driver circuit 204. The output of the driver circuit 204 is coupled to the gate of $M_{CP1}$. In the illustrated example, a low-dropout (LDO) power supply 206 provides power to the level shifter 202 and the driver circuit 204. As described in U.S. patent application Ser. No. 17/331,594 referenced above, the LDO power supply 206 can selectively increase $R_{ON}$ for a power FET in a power converter by actively controlling the driver voltage to the gate of the power FET. During normal power converter operation, the power FET driver voltage may be set to overdrive the FET gate to lower $R_{ON}$ to a desired level that allows high current flow for a particular application. However, for other scenarios (e.g., during soft-startup), the power FET driver voltage may be reduced so as to increase Rory and thus impede current flow through the power FET to a desired level.

LDO Power Supply Embodiment with Reduced Gate-Drive Capability

Figure 3:
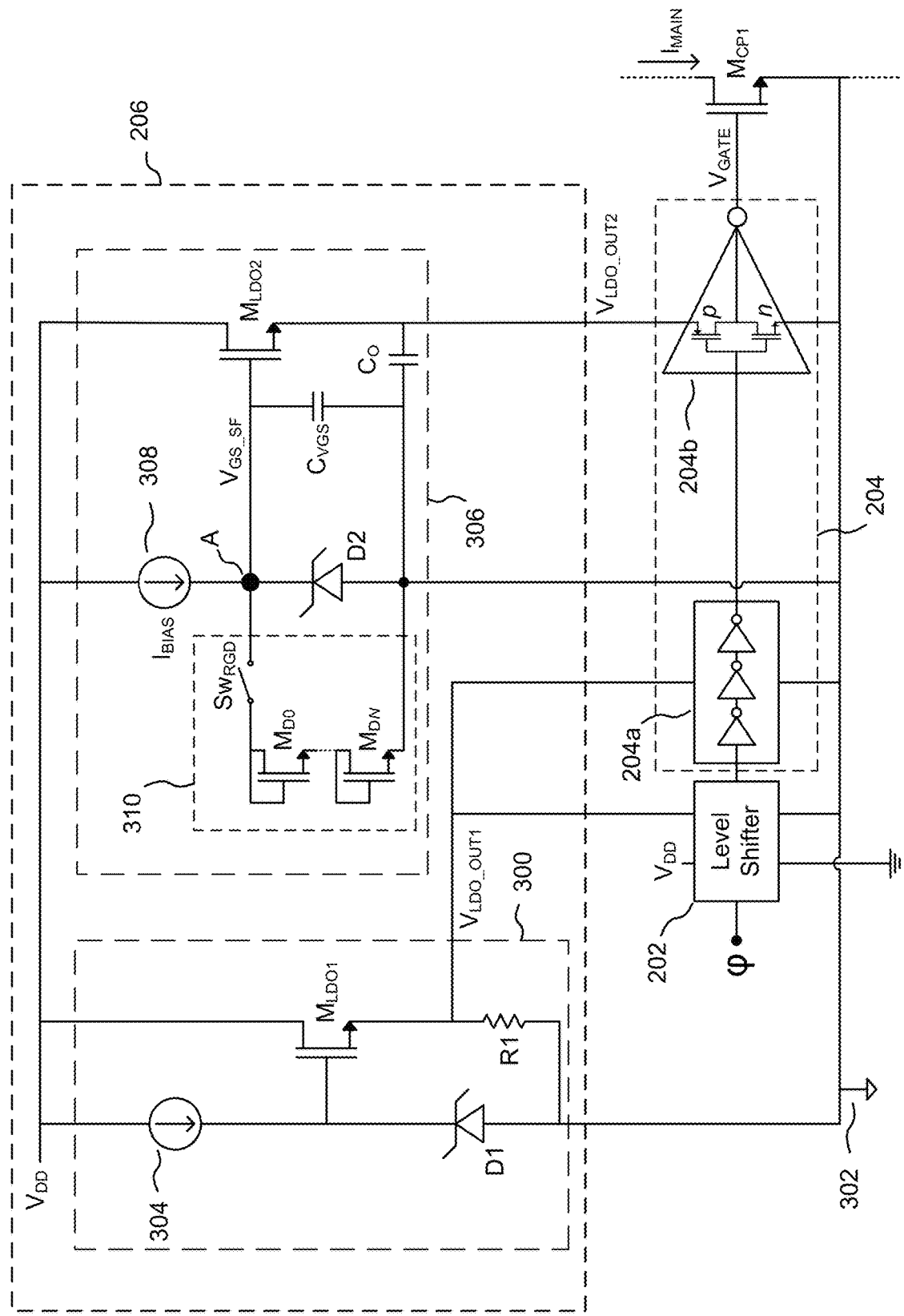
FIG. 3 is a schematic diagram of one embodiment of the LDO power supply of FIG. 2.

FIG. 3 is a schematic diagram of one embodiment of the LDO power supply 206 of FIG. 2. As in FIG. 2, the LDO power supply 206 provides power to a level shifter 202 and to a driver 204 coupled to the gate of an associated power FET $M_{CP1}$. The input to the gate control circuit, φ (e.g., either clock signal P1 or clock signal P2, or an ON or OFF control signal), is applied to the input of the level shifter 202. The level shifter 202 translates the input signal from one voltage domain (e.g., digital logic voltages) to another voltage domain (e.g., transistor control voltages). The output of the level shifter 202 thus follows the input signal but in a different voltage range.

The output of the level shifter 202 is coupled to the input of a driver circuit 204, the output of which is coupled to the gate of FET $M_{CP1}$. In the illustrated example, the driver circuit 204 includes a pre-driver 204a (comprising a set of three series-coupled inverters in this example) and a series-coupled final inverter 204b. Internally, the final inverter 204b has at least one NMOS FET n and one PMOS FET p with coupled conduction channels, drain-to-drain, with each FET n, p having a gate driven by the output of the pre-driver 204a. The drains of PMOS FET p and of NMOS FET n are coupled to the gate of power FET $M_{CP1}$.

In some embodiments, the inverters may increase in physical size from inverter to inverter in order to provide sufficient current drive capability to charge the gate of FET $M_{CP1}$. For example, in a driver circuit 204 having three series-coupled inverters in the pre-driver 204a, the first inverter may have a relative size of "1", the second inverter may be 3 times larger than the first inverter, and the third inverter may be 9 times larger than the first inverter. Lastly, the final inverter 204b may be 27 times larger than the first inverter in the pre-driver 204a. The multipliers for the stages may differ from the 1×, 3×, 9×, and 27× ratios, although generally each stage is larger than the previous one to avoid having very slow rising and falling edges. In alternative embodiments, the number of inverter stages may be fewer or greater, and non-inverting stages (buffer amplifiers) may be used rather than inverting stages. Accordingly, the illustrated driver circuit 204 is exemplary only, and other circuits may be used to couple the output of the level shifter 202 to the gate of FET $M_{CP1}$.

Power to the level shifter 202 and the driver circuit 204 is provided by LDO power supply 206. In the illustrated example, the power source for the level shifter 202 and the pre-driver 204a is provided by a first LDO section 300. The first LDO section 300 comprises a source follower (common drain) amplifier circuit that includes a regulated FET $M_{LDO1}$ having its conduction channel (between drain and source) coupled in series with a resistor 121 between a supply voltage, $V_{DD}$, and a floating reference potential 302. As an example, the supply voltage $V_{DD}$ may be $V_{IN}$ to one phase of the charge pump that includes FET $M_{CP1}$ or may be coupled to the voltage output from another phase of the charge pump—basically, any voltage than is sufficiently high and has sufficient drive strength for the circuit. A current source 304 is coupled in series with a Zener diode D1 between $V_{DD}$ and the reference potential 302. A current source may be configured from transistors and/or diodes using a variety of circuits. The output of the current source 304 before the Zener diode D1 provides an essentially constant bias voltage to the gate of FET $M_{LDO1}$. The bias current flows through the Zener diode D1 and ensures that the diode is always in reverse bias. The source of the FET $M_{LDO1}$ provides a drive voltage $V_{LDO\_OUT1}$ to the level shifter 202 and the pre-driver 204a.

Unlike a conventional diode that blocks any flow of current through itself when reverse biased, as soon as the reverse voltage reaches a pre-determined value, a Zener diode begins to conduct. This applied reverse voltage remains almost constant even with large changes in current (so long as the current remains between a breakdown minimum current and a maximum current rating for the Zener diode). A Zener diode continues to regulate its voltage until the holding current of the diode falls below the minimum current value in the reverse breakdown region.

The final inverter 204b is powered by a second LDO section 306 that includes a source-follower FET $M_{LDO2}$ having its conduction channel (between drain and source) coupled between the supply voltage $V_{DD}$ and the final inverter 204b. The gate of FET $M_{LDO2}$ is coupled to a separate gate driver circuit that is independent of the gate driving circuitry for FET $M_{LDO1}$. The principal function of the gate driver circuit of the second LDO section 306 is to enable at least two different voltage levels at Node A to be coupled to the gate of FET $M_{LDO2}$, which in turn determines the output voltage level $V_{GATE}$ provided by the final inverter 204b driving the associated power FET $M_{CP1}$. The associated power FET $M_{CP1}$ thus can be placed into (1) an overdriven or "full gate-drive" ON state having low $R_{ON}$ for normal power converter operation, or (2) at least one current-limiting reduced gate-drive ON state having a higher $R_{ON}$ selected to provide protection against potentially damaging events (e.g., in-rush or charge transfer current), such as during dynamic re-configuration of the conversion ratio of the power converter, during power converter startup, when balancing charge among fly capacitors within the power converter, or during fault events such as short circuit events.

The gate driver circuit for FET $M_{LDO2}$ includes a current source 308 coupled in series with a Zener diode D2 between $V_{DD}$ and the reference potential 302. The gate of FET $M_{LDO2}$ is coupled to Node A between the current source 308 and the Zener diode D2. The output $I_{BIAS}$ of the current source 308 before the Zener diode D2 at Node A provides an essentially constant bias voltage $V_{GS\_SF}$ to the gate of FET $M_{LDO2}$. The source of the FET $M_{LDO2}$ provides a drive voltage $V_{LDO\_OUT2}$ to the final driver 204b.

In parallel with the Zener diode D2 is a voltage control circuit 310 comprising a reduced gated-drive switch $Sw_{RGD}$ series-coupled to a first diode-connected FET $M_{D0}$ and at least one additional diode-connected FET $M_{DN}$, where N≥1. As illustrated, one terminal of the switch $Sw_{RGD}$ is coupled to Node A, and one terminal of the additional diode-connected FET $M_{DN}$ is coupled to the floating reference potential 302. Note that the switch $Sw_{RGD}$ may be positioned anywhere along the voltage control circuit 310 to interrupt or enable current flow through that circuit. For example, the order of switch $Sw_{RGD}$ and FETs $M_{D0}$ and $M_{DN}$ from Node A the floating reference potential 302 may be (1) $Sw_{RGD}$, $M_{D0}$, $M_{DN}$ (as illustrated), (2) $M_{D0}$, $Sw_{RGD}$, $M_{DN}$, or (3) $M_{D0}$, $M_{DN}$, $Sw_{RGD}$. However, positioning the switch $Sw_{RGD}$ as shown in FIG. 3 may reduce parasitic influences on FET $M_{LDO2}$ due, for example, to the capacitances of FETs $M_{D0}$ and/or $M_{DN}$.

A decoupling capacitor $C_O$ is coupled between the source of FET $M_{LDO2}$ and the floating reference potential 302. A capacitor $C_{VGS}$ is coupled between the gate of FET $M_{LDO2}$ and the floating reference potential 302 to maintain essentially a constant voltage across the Zener diode D2 when the floating reference potential 302 switches voltages.

A function of the diode-connected FET $M_{D0}$ is to offset FET $M_{LDO2}$, since the threshold voltages of FET $M_{D0}$ and FET $M_{LDO2}$ effectively cancel. A function of the additional diode-connected FETs $M_{DN}$ is to set the current $I_{MAIN}$ through FET $M_{CP1}$ in proportion to the ratio of the sizes of FET $M_{CP1}$ to FET $M_{DN}$ when switch $Sw_{RGD}$ is CLOSED and the current mirror function of the voltage control circuit 310 is engaged. More particularly, the current $I_{MAIN}$ through FET $M_{CP1}$ is proportional to the current $I_{BIAS}$ from the current source 308 and the size ratio of FET $M_{DN}$ to FET $M_{CP1}$. For example, if the current source 308 output is 1 mA, and FET $M_{CP1}$ is 1,000 times the size of FET $M_{DN}$ (W/L $M_{CP1}$=1000× W/L $M_{DN}$), then the maximum current through FET $M_{CP1}$ is 1,000×1 mA=1 A. This is achieved by ensuring the gate-to-source voltage $V_{GS}$ of FET $M_{DN}$ is the same as that of FET $M_{CP1}$. The maximum gate voltage of FET $M_{CP1}$ is the voltage at Node A minus the threshold voltage $V_{TH}$ of FET $M_{LDO2}$. Including FET $M_{D0}$ increases the voltage at Node A by a second threshold voltage $V_{GS}$, so the voltage at Node A=($V_{GS}$ of FET $M_{DN}$)+($V_{TH}$ of FET $M_{D0}$), or $2V_{GS}$. If FET $M_{LDO2}$ and FET $M_{D0}$ are matched (ratiometrically), then the maximum the $V_{GS}$ of FET $M_{CP1}$ can reach is the same as the $V_{GS}$ of FET $M_{DN}$, and this equality tracks over process, temperature, etc.

As noted, the diode-connected FET(s) $M_{DN}$ are ratioed in size with respect to FET $M_{CP1}$. In some embodiments, FETs $M_{LDO1}$, $M_{LDO2}$, $M_{D0}$, and $M_{CP1}$ may be segmented FETs, meaning that a device intended to function as a large FET is fabricated as multiple (e.g., 10,000) small FETs coupled in parallel (the individual small FETs may be called "fingers", reflecting typical aspects of their physical layout on an IC die). The diode-connected FET(s) $M_{D0}$, $M_{DN}$ may be fabricated using the same technology, but can be made with a much smaller number of FET fingers (e.g., as few as one finger). Because of the source-follower configuration of FET $M_{LDO2}$ and the final inverter 204b, a small change in current flow through the voltage control circuit 310 affecting the voltage at the gate of FET $M_{LDO2}$ causes a proportionally larger current flow $I_{MAIN}$ through power FET $M_{CP1}$ determined by the size ratio of FET $M_{CP1}$ to FET $M_{DN}$.

Adding more than one diode-connected FET $M_{DN}$ allows adjustment of the size ratio of FET $M_{CP1}$ to FET $M_{DN}$. For instance, if FET $M_{CP1}$ has a width of 100 and 1,000 fingers, then a first FET $M_{DN}$ should also have a width of 100 to match (but may only have 1 finger). Hence the size ratio of FET $M_{DN}$ to FET $M_{CP1}$ is 1,000 to 1, and 1 mA from the current source 308 means 1 A through FET MCP1. To change the size ratio to 2,000 to 1, two diode-connected FETs $M_{DN}$ may be coupled in series (source to drain). If the FET width is still 100, the effective number of fingers of the two diode-connected FETs $M_{DN}$ is one-half, giving a size ratio of 2,000 to 1 with respect to FET $M_{CP1}$.

As noted above, an important function of the gate driver circuit is that it provides a selectable amount of regulated gate bias voltage $V_{GS\_SF}$ to FET $M_{LDO2}$, which in turn controls the power supply to, and voltage output of, the final inverter 204b. When switch $Sw_{RGD}$ is OPEN, then the voltage control circuit 310 is disconnected from Node A—and therefore from the gate of FET $M_{LDO2}$—and thus has essentially no effect on the output of FET $M_{LDO2}$; accordingly, the final inverter 204b can overdrive the gate of FET $M_{CP1}$ to a selected level determined by the Zener diode D2.

When switch $Sw_{RGD}$ is CLOSED—such as during startup of the power converter or when dynamically switching conversion ratios or rebalancing charge amount fly capacitors—then the voltage control circuit 310 operates as a bypass to divert current around diode D2 and lower the voltage at Node A, thus reducing the drive voltage to FET $M_{LDO2}$. The reduced gate-drive voltage to FET $M_{LDO2}$ in turn reduces the power to the final inverter 204b and thus reduces the gate-drive voltage $V_{GATE}$ to the power FET $M_{CP1}$. If the drain-source voltage $V_{DS}$ is high enough to cause the power FET $M_{CP1}$ to be in saturation, then the power FET $M_{CP1}$ acts as a controlled current-limited source. If $V_{DS}$ is below the level that would cause the power FET $M_{CP1}$ to be in saturation, then the power FET $M_{CP1}$ should be in its linear range of operation with an increased $R_{ON}$ value compared to the $R_{ON}$ value when in a normal overdriven state. In either case—saturation-mode controlled current-limited source or linear-mode increased $R_{ON}$—at least some of the power FETs of a power converter may limit the current in the FETs and therefore inhibit excessive current spikes, thus protecting the power FETs (as well as other coupled circuitry) from large voltage spikes. Selectively varying the $I_{BIAS}$ current controls the value of $V_{GATE}$ applied to the power FET $M_{CP1}$, thus enabling selection of different increased values of $R_{ON}$.

In some embodiments, reduced gate-drive operation of a power FET in the ON state to limit current spikes during potentially damaging events may be enabled (triggered) by a control circuit (not shown) as a function of a measured parameter, such as the value of $V_{IN}$, $V_{OUT}$, pump capacitor voltages, or load current, and/or as the result of sensed events, such as short circuit events and/or charge imbalances on the pump capacitors. In some embodiments, reduced gate-drive operation of a power FET in the ON state to limit current spikes during potentially damaging events may be enabled (triggered) based on an external control signal for switch $Sw_{RGD}$ that is asserted in advance of a known impending event, such as dynamic switching of conversion ratios.

The duration of reduced gate-drive operation for the power FETs may be set as a fixed time suitable for a particular application or may be determined based on some criteria. For example, reduced gate-drive operation for the power FETs may be a function of output load, or a function of output load and a selected maximum duration (i.e., a time-out parameter), or a function of the voltage across the fly capacitors having reached some percentage (e.g., 95%) of a desired target level, or some combination of these values and/or the values of other parameters.

An advantage of using diode-connected FETs in the voltage control circuit 310 fabricated using the same technology as the power FETs (e.g., NMOSFET) is that the devices essentially have matching characteristics with respect to process/voltage/temperature (PVT) variations.

In summary, the principal function of the gate driver circuit 306 is to enable at least two different voltage levels at Node A to be coupled to the gate of FET $M_{LDO2}$. More specifically, the voltage control circuit 310 can selectably shift the voltage at Node A between a first voltage level, in which the voltage control circuit 310 is not engaged (switch $Sw_{RGD}$ is OPEN) and at least a second voltage level, in which the voltage control circuit 310 is engaged (switch $Sw_{RGD}$ is CLOSED).

It should be appreciated that while the second LDO section 306 illustrated in FIG. 3 is preferred as simple to implement, requiring little power and circuit area, other devices or circuits that provide the same or similar function may be used in other embodiments. For example, Node A could be coupled through switch $Sw_{RGD}$ to an amplifier having a level-shifted reference voltage as an input; the gate voltage to FET $M_{LDO2}$ would be more accurate but at the expense of complexity, circuit area, and power (and thus efficiency).

Note that the LDO power supply 206 of FIG. 3, including the second LDO section 306, may be used to power all of the FET switches in a power converter 100 to limit currents through such switches as may be needed (for example, when dynamically changing the conversion ratio of the power converter 100). In some instances, a level shifter 202 circuit would not be required for some FET switches (e.g., switches S5 and S7 in FIG. 1), in which case y may be applied directly to the associated pre-driver 204a.

Enhanced LDO Power Supply Embodiments with Reduced Gate-Drive Capability

In many applications, the LDO power supply 206 of FIG. 3 works perfectly well at a specified fixed switching frequency (e.g., 400 kHz). However, in some applications, it may not be desirable to switch at the specified fixed frequency during a startup or transition period. In light of the fact that the LDO power supply 206 is an open loop implementation, a possible operational limitation arises since the current limiting function (reduced gate-drive) of the circuit may vary depending on the switching frequency of the associated power converter 100.

Figure 4A:
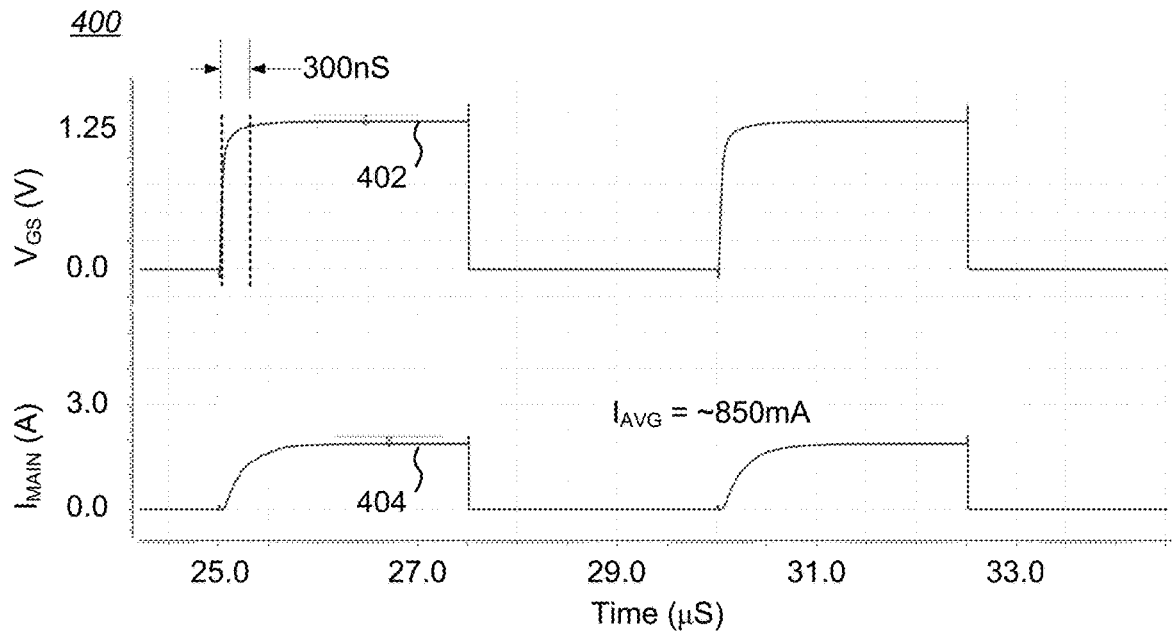
FIG. 4A is a graph showing the gate voltage $V_{GS}$ for the FET $M_{CP1}$ and the current $I_{MAIN}$ through FET $M_{CP1}$ as a function of time at a switching frequency of kHz in a reduced gate-drive mode of operation.

For example, FIG. 4A is a graph 400 showing the gate voltage $V_{GS}$ for the FET $M_{CP1}$ and the current $I_{MAIN}$ through FET $M_{CP1}$ as a function of time at a switching frequency of 200 kHz in a reduced gate-drive mode of operation. Graph line 402 shows that the rise time of $V_{GS}$ in the reduced gate-drive mode is about 300 nS (compared to about 5-10 nS in full gate-drive mode) at the selected frequency of operation for the associated power converter 100. Graph line 404 shows that the corresponding limited current flow through FET $M_{CP1}$ due to the reduced gate-drive voltage is fully settled at the selected switching frequency by the time $V_{GS}$ is settled. In the illustrated example, the resulting average current $I_{AVG}$ at the selected frequency of operation is about 850 mA.

Figure 4B:
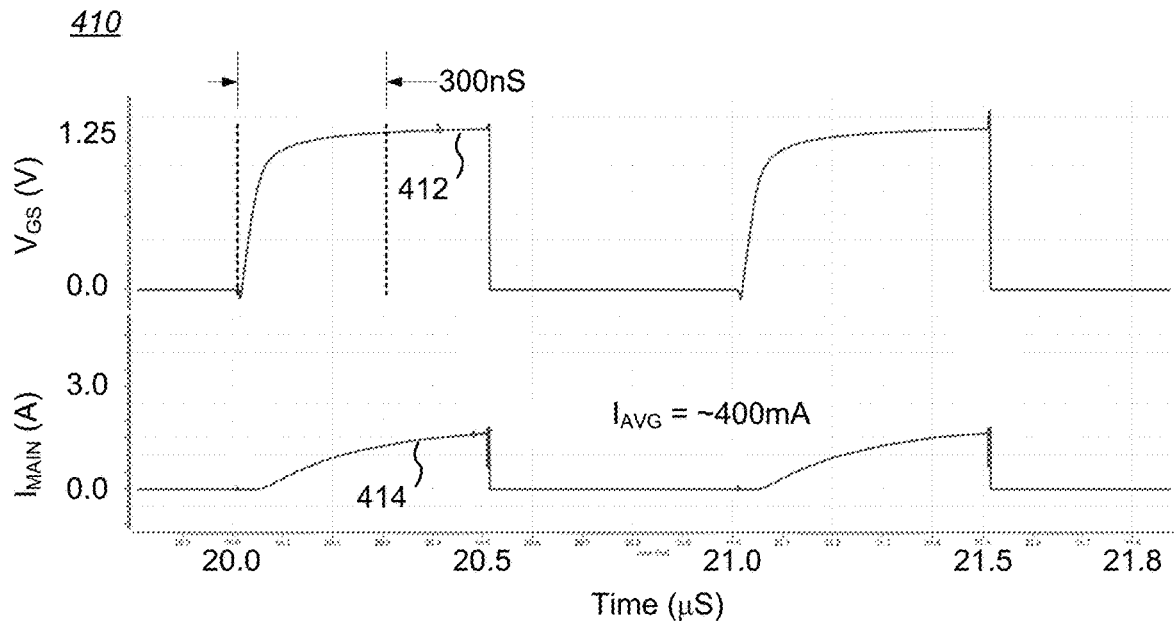
FIG. 4B is a graph showing the gate voltage $V_{GS}$ for FET Man and the current NAIN through FET $M_{CP1}$ as a function of time at a switching frequency of 1 MHz in a reduced gate-drive mode of operation.

FIG. 4B is a graph 410 showing the gate voltage $V_{GS}$ for FET $M_{CP1}$ and the current $I_{MAIN}$ through FET Mon as a function of time at a switching frequency of 1 MHz in a reduced gate-drive mode of operation. Graph line 412 shows that the rise time of $V_{GS}$ in the reduced gate-drive mode is about 300 nS (note that the time scales in FIGS. 4A and 4B differ) at the selected frequency of operation for the associated power converter 100. Graph line 414 shows the corresponding limited current flow through FET $M_{CP1}$ due to the reduced gate-drive voltage still rising and not being settled at the higher switching frequency by the time $V_{GS}$ is settled. In the illustrated example, the resulting average current $I_{AVG}$ at the selected frequency of operation is about 400 mA. This lower amount of average current $I_{AVG}$ through FET $M_{CP1}$ during a soft-start results in a slow power-up of the power converter 100. Accordingly, the IC may not meet a customer's specification. In addition, if $I_{AVG}$ is much lower than a typically-designed current value in some IC PVT corners and operating conditions, then the LDO power supply 206 may not output the minimum sourcing current required to support a load current.

The frequency dependency of the LDO power supply 206 may allow a large current spread between the minimum and maximum current allowed through FET $M_{CP1}$. Other possible contributors to a large current spread include mismatches between the devices (for example, a mismatch between $M_{D0}$ and $M_{LDO2}$ and/or between $M_{DN}$ and $M_{CP1}$) which may also result in different current limits on different devices, and the dependency of the gate rising time for FET $M_{CP1}$ on process and temperature variations, which adds extra spread to the device current limit. A large current spread may allow the current $I_{MAIN}$ through FET $M_{CP1}$ to exceed the current handling capability of the FET, or to fall below the minimum current required to support an output load. A large current spread also affects device reliability and may cause a drop in output voltage at full output load.

The present invention provides several enhanced LDO power supply circuits having a reduced gate-drive capability, along with corresponding methods, that accurately limit power FET current in a reduced gate-drive mode of operation and are independent of switching frequency as well as device mismatches and PVT variations. The inventive LDO power supply circuits provide reliable operation of power FETs within a power converter during dynamic re-configuration of the conversion ratio of the power converter, and also provide a level output voltage (essentially without drop) when a power converter operates at full load in different operating and PVT conditions.

Figure 5:
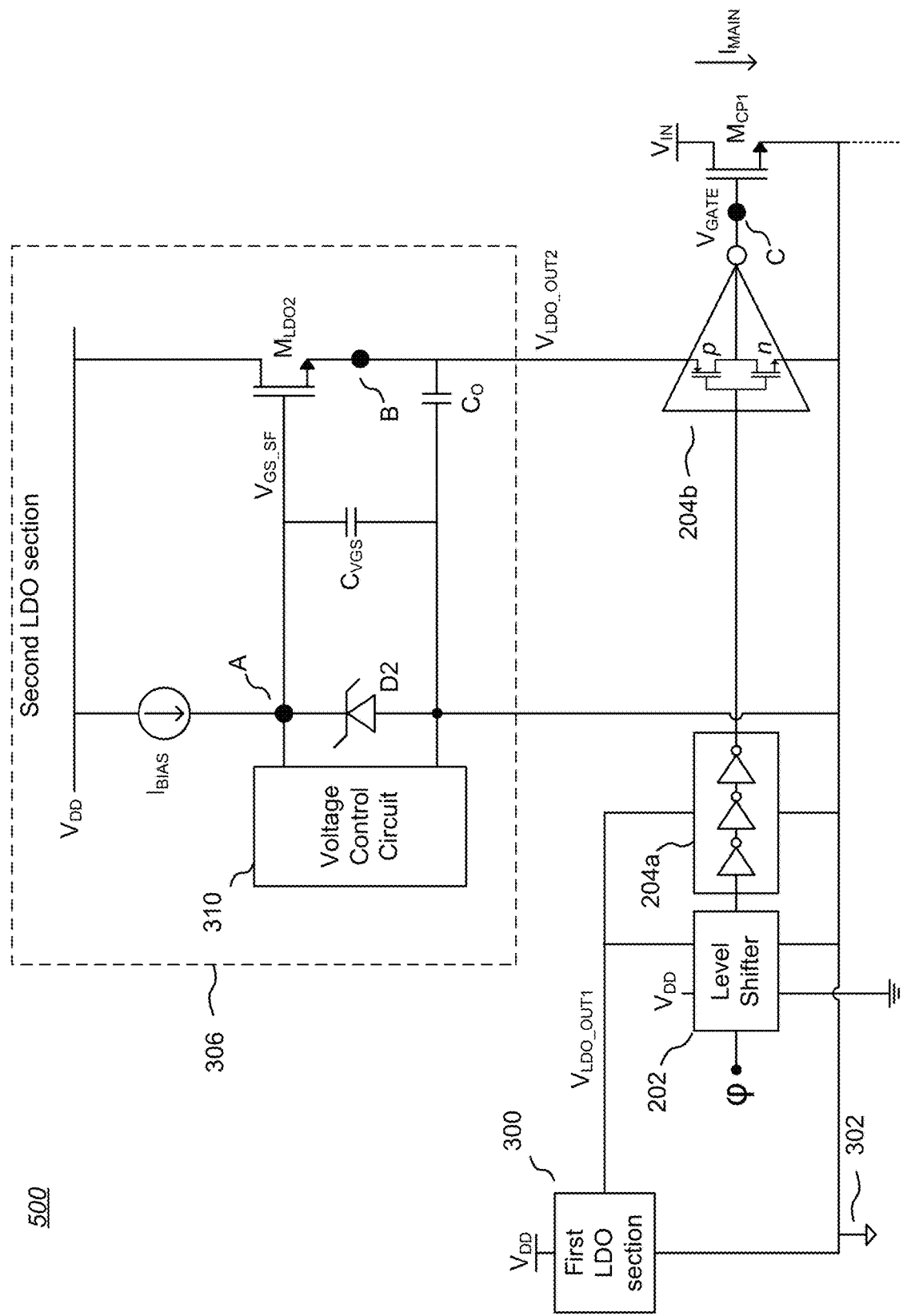
FIG. 5 is a block diagram of an LDO power supply circuit showing possible connections nodes A, B, and C for added feedback or compensation circuits.

In contrast to the open-loop implementation of the LDO power supply 206 of FIG. 3, embodiments of the present invention utilize an added closed-loop feedback circuit and/or an added calibrated compensation circuit to closely control the control voltage $V_{GATE}$ applied to the gate of the power FET $M_{CP1}$. Depending on the nature of the added circuit, connection to the LDO power supply 206 may be made at one of several nodes. For example, FIG. 5 is a block diagram of an LDO power supply circuit 500 showing possible connections nodes A, B, and C for added feedback or compensation circuits.

Connecting a feedback or compensation circuit at node A allows the gate voltage $V_{GS\_SF}$ of the source-follower FET $M_{LDO2}$ to be regulated to control $V_{LDO\_OUT2}$ to the final inverter 204b so that $V_{GATE}$ is adjusted to provide a reduced gate-drive to the power FET $M_{CP1}$ that is substantially independent of frequency. Connecting a feedback or compensation circuit at node B allows $V_{LDO\_OUT2}$ to the final inverter 204b to be directly regulated so that $V_{GATE}$ is adjusted to provide a reduced gate-drive to the power FET $M_{CP1}$ that is substantially independent of frequency. Connecting a feedback or compensation circuit at node C allows $V_{GATE}$ to be directly set to provide a reduced gate-drive to the power FET $M_{CP1}$ that is substantially independent of frequency. Details of several example embodiments of such feedback or compensation circuits are set forth in the following subsections.

A. Closed-Loop Direct Supplementation of $V_{GS\_SF}$

Figure 6A:
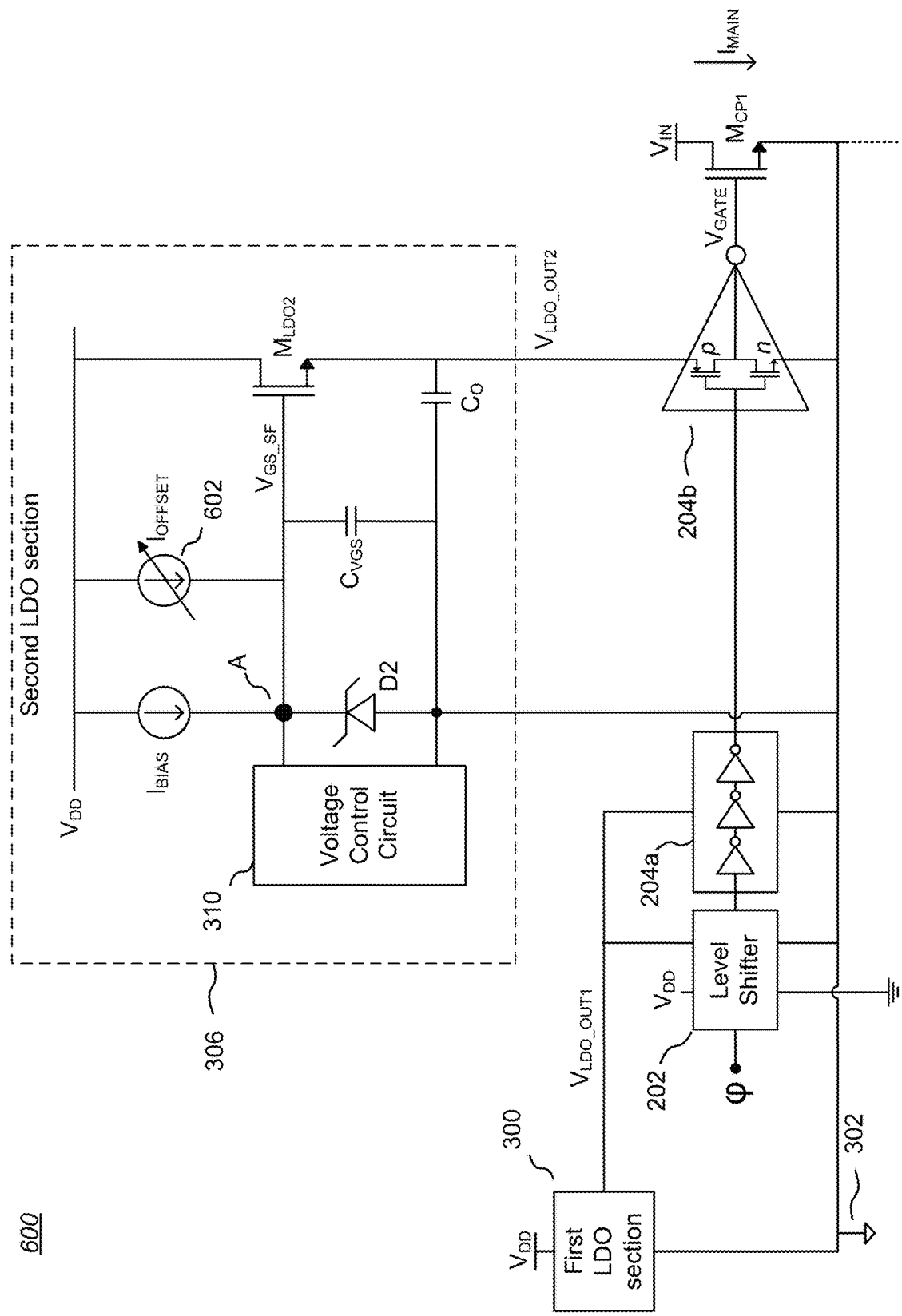
FIG. 6A is a block diagram of a first embodiment of an enhanced LDO power supply utilizing a closed-loop direct supplementation of $V_{GS\_SF}$.

FIG. 6A is a block diagram of a first embodiment of an enhanced LDO power supply 600 utilizing a closed-loop direct supplementation of $V_{GS\_SF}$. Similar in most aspects to the LDO power supply 206 of FIG. 3, the enhanced LDO power supply 600 differs by including a closed-loop supplemental variable current source 602 coupled to Node A, configured to directly provide an offset current $I_{OFFSET}$ designed to increase or decrease the gate voltage $V_{GS\_SF}$ of the source-follower FET $M_{LDO2}$. The offset current $I_{OFFSET}$ is proportional to a target reference current $I_{TARGET}$ minus either $I_{MAIN}$ or a current value that is proportional to $I_{MAIN}$. Thus, $I_{OFFSET}=K*(I_{TARGET}-I_{MAIN})$, where K is a proportionality constant that may represent, for example, the size ratio of FET $M_{DN}$ (inside the voltage control circuit 310) to FET $M_{CP1}$.

In operation, the second LDO section 306 is initially biased by $I_{BIAS}$. The current through power FET $M_{CP1}$ is compared with a target reference current and the feedback offset current $I_{OFFSET}$ is generated based on any difference. In the reduced gate-drive mode, any generated value of $I_{OFFSET}$ adds to $I_{BIAS}$ and, when applied through the voltage control circuit 310, increases or decreases the gate voltage $V_{GS\_SF}$ of the source-follower FET $M_{LDO2}$, thereby increasing $I_{MAIN}$ until $I_{MAIN}$ equates to $I_{TARGET}$. Accordingly, FIG. 6A is an example of a closed-loop direct supplementation of $V_{GS\_SF}$.

Figure 6B:
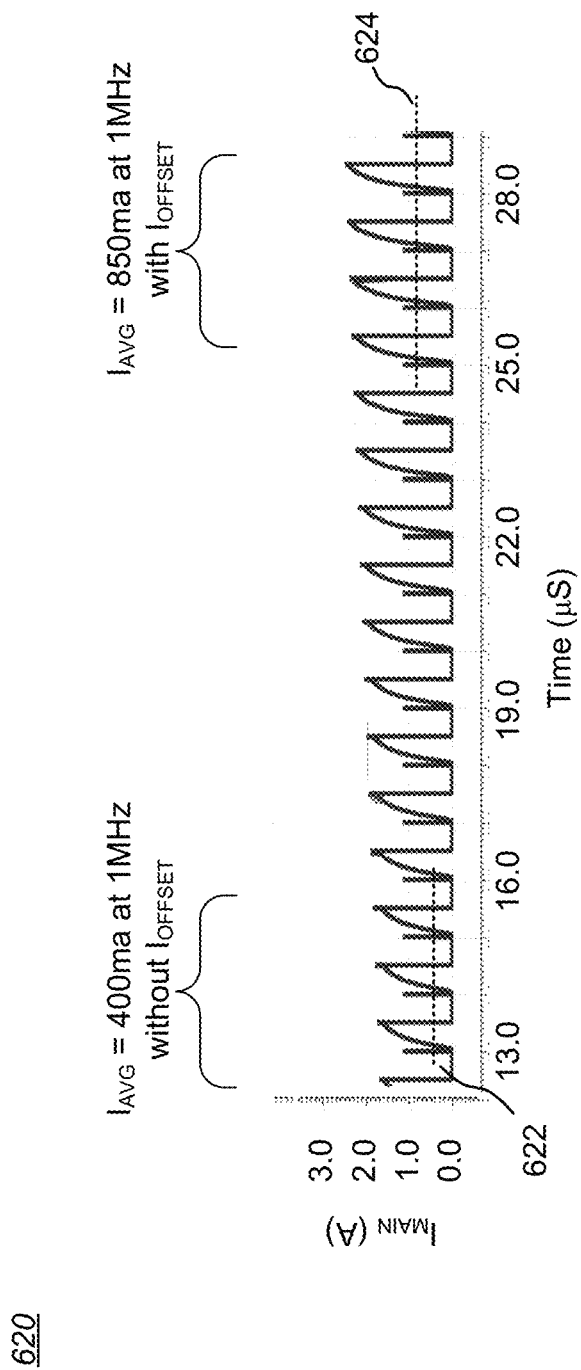
FIG. 6B is a graph showing the current $I_{MAIN}$ through FET $M_{CP1}$ as a function of time at a switching frequency of 1 MHz in a reduced gate-drive mode of operation.

The feedback loop adapts $I_{MAIN}$ regardless of frequency. As an example, FIG. 6B is a graph 620 showing the current $I_{MAIN}$ through FET $M_{CP1}$ as a function of time at a switching frequency of 1 MHz in a reduced gate-drive mode of operation. In this example, the average current $I_{AVG}$ at the selected frequency of operation is about 400 mA (dotted line 622), but ramps up to about 850 mA (dotted line 624) when the feedback offset current $I_{OFFSET}$ is generated and applied (compare FIG. 4A, showing $I_{AVG}$ equals about 850 mA at 200 KHz). The supplemental feedback offset current $I_{OFFSET}$ increases the gate voltage $V_{GS\_SF}$ of the source-follower FET $M_{LDO2}$, thereby increasing $I_{MAIN}$ for a time.

A number of circuits may be used for the closed-loop supplemental variable current source 602. For example, FIG. 7A is a block diagram of an example circuit for generating the supplemental feedback offset current $I_{OFFSET}$. The current through the power FET $M_{CP1}$, $I_{MAIN}$, is coupled to a current-to-voltage converter 702 which generates an output voltage $V_{CP1}$ that is proportional to the magnitude of $I_{MAIN}$. After filtering through a low-pass filter 704 to obtain an average value, $V_{CP1}$ is coupled to a first input of an operational transconductance amplifier (OTA) 706. A second input to the OTA 706 is a reference voltage $V_{REF}$ that is proportional to a target reference current $I_{TARGET}$. The OTA 706 sources or sinks an output current $I_{OFFSET}$ whose magnitude is proportional to the differential input voltages. The output current $I_{OFFSET}$ is applied to Node A in the circuit of FIG. 6A as described above.

FIG. 7B is a schematic diagram of a first example embodiment of a current-to-voltage converter 702. The output of the final inverter 204b, $V_{GATE}$, is shown coupled to the gate of power FET $M_{CP1}$ and to the gate of a scaled replica FET, $M_{REP}$. The scaled replica FET $M_{REP}$ may be, for example, 0.001% the size of power FET $M_{CP1}$, and accordingly, has little effect on the operation of the power FET $M_{CP1}$ but does conduct a current, $I_{SENSE}$, that is proportional to $I_{MAIN}$. Applying $I_{SENSE}$ through a resistor R generates the output voltage $V_{CP1}$.

FIG. 7C is a schematic diagram of a second example embodiment of a current-to-voltage converter 702. The output of the final inverter 204b, $V_{GATE}$, is shown coupled to the gate of power FET $M_{CP1}$ and to the gate of a scaled replica FET, $M_{REP}$. The scaled replica FET $M_{REP}$ may be, for example, 0.001% the size of power FET $M_{CP1}$, and conducts a current, $I_{SENSE}$, that is proportional to $I_{MAIN}$. Both $I_{SENSE}$ and $I_{MAIN}$ are coupled to respective first and second inputs of a differential amplifier 708 that generates an output voltage $V_{OUT}$ proportional to the difference between $I_{SENSE}$ and $I_{MAIN}$. Output voltage $V_{OUT}$ is coupled to the gate of a feedback FET, $M_{FB}$, the source of which is coupled to the first input of the differential amplifier 708. The drain of feedback FET $M_{FB}$ is coupled to a resistor R, thus generating the output voltage $V_{CP1}$. An advantage of the current-to-voltage converter 702 shown in FIG. 7C is that it maintains the same drain-to-source voltage $V_{DS}$ across the power FET $M_{CP1}$ and scaled replica FET $M_{REP}$ and thus generates a more accurate sense current $I_{SENSE}$.

B. Closed-Loop Indirect Supplementation of $V_{GS\_SF}$

Figure 8:
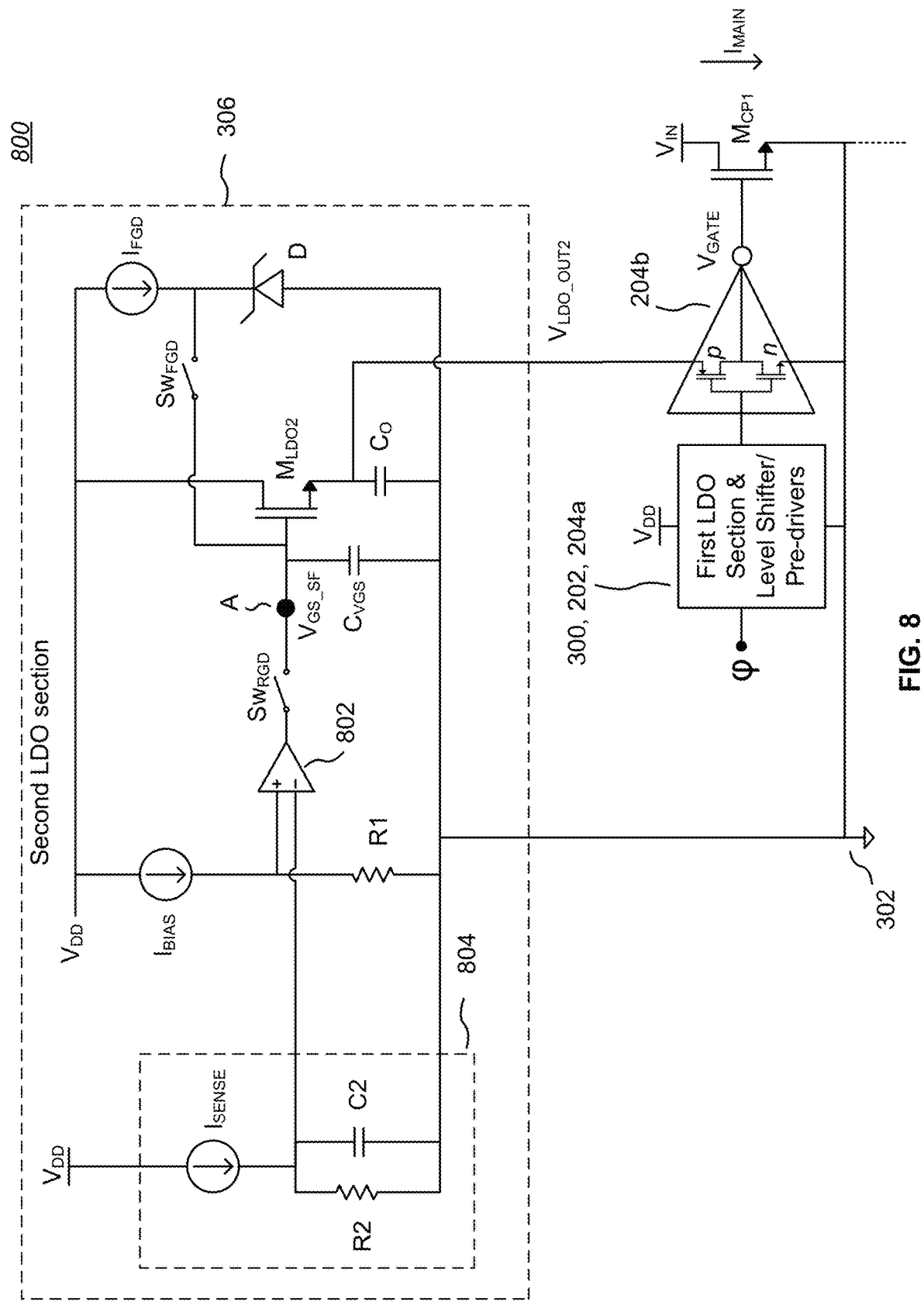
FIG. 8 is a block diagram of a second embodiment of an enhanced LDO power supply.

FIG. 8 is a block diagram of a second embodiment of an enhanced LDO power supply 800. Similar in many aspects to the LDO power supply 206 of FIG. 3, the enhanced LDO power supply 600 differs by including circuitry for generating a closed-loop indirect supplementation of $V_{GS\_SF}$.

In greater detail, separate full gate-drive and reduced gate-drive current sources are provided. More specifically, a full gate-drive current source $I_{FGD}$ coupled in series with a diode D between $V_{DD}$ and a floating reference potential 302, such as circuit ground, drives the gate of FET $M_{LDO2}$ when full gate-drive switch $Sw_{FGD}$ is closed and reduced gated-drive switch $Sw_{RGD}$ is open. Conversely, in the reduced gate-drive mode, full gate-drive switch $Sw_{FGD}$ is open and reduced gated-drive switch $Sw_{RGD}$ is closed.

For the reduced gated-drive mode, a current source $I_{BIAS}$ is coupled in series with a resistor 121 between $V_{DD}$ and the floating reference potential 302. The voltage generated across the resistor 121 is coupled to a first input of a differential amplifier 802. The output of the differential amplifier 802 is selectably couplable to Node A, and thus to the gate of the FET $M_{LDO2}$, through the reduced gated-drive switch $Sw_{RGD}$.

A second input of the differential amplifier 802 is coupled to a feedback circuit 804 that includes a variable current source $I_{SENSE}$ coupled in series with an RC circuit between $V_{DD}$ and the floating reference potential 302. The RC circuit, comprising a parallel resistor R2 and capacitor C2, acts as a filter and provides an average voltage at the second input of the differential amplifier 802. The current source $I_{SENSE}$ may be, for example, a scaled replica FET, $M_{REP}$ having a gate coupled to the output $V_{GATE}$ of the final inverter 204b, as in FIG. 7B. Thus, $I_{SENSE}$ is proportional to $I_{MAIN}$ (e.g., 1/10, 000$^{th}$ of $I_{MAIN}$). The $I_{SENSE}$ current applied to resistor R2 and capacitor C2 provides an averaged voltage input to the differential amplifier 802. The differential amplifier 802 corrects the difference between $I_{BIAS}$ and the closed-loop feedback current $I_{SENSE}$ by setting up a corresponding $V_{GS\_SF}$ voltage. Note that in the embodiment of FIG. 8, the Zener diode D2 of the embodiments shown in some of the other novel embodiments is not required in reduced gated-drive mode, since the output of the differential amplifier 802 is set to a desired level to provide a reduced gate drive voltage. An advantage of the embodiment of FIG. 8 is that it generally has a low output impedance and high feedback loop stability.

C. Example Compensation Circuit Coupled to Node A

Another approach to providing a reduced gate-drive to a power FET $M_{CP1}$ that is substantially independent of frequency is to apply a calibrated compensation voltage boost to briefly increase the drive capability of an LDO power supply 206 to offset the slow rise time of $V_{GATE}$ from the final inverter 204b caused by the relatively large gate capacitance of the power FET $M_{CP1}$ (e.g., about 20 µF in some MOSFET implementations). State another way, the compensation voltage boost briefly increases the reduced gate-drive voltage to the gate of the power FET to compensate for the gate capacitance of the power FET.

Figure 9A:
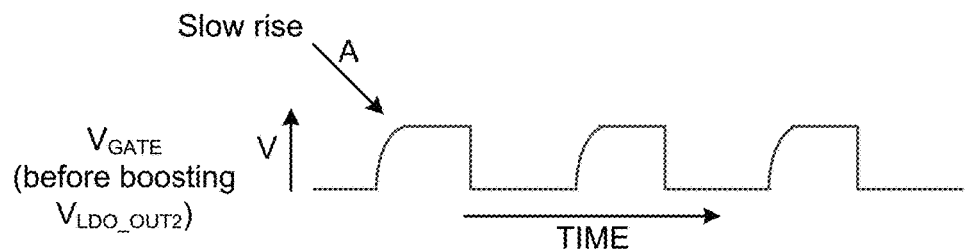
FIG. 9A is a graph of $V_{GATE}$ as a function of time without the benefit of a compensation voltage boost.
Figure 9B:
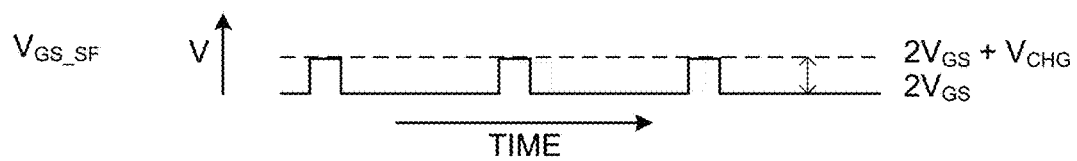
FIG. 9B is a graph of $V_{GS\_SF}$ as a function of time, showing the periodic augmentation to the normal $2V_{GS}$ voltage that a compensation voltage boost $V_{CHG}$ provides if applied at Node A.
Figure 9C:
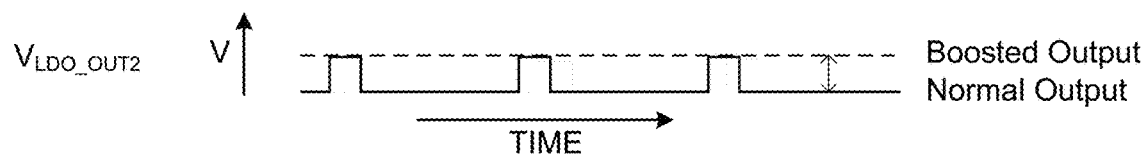
FIG. 9C is a graph of $V_{LDO\_OUT2}$ as a function of time, showing the periodic augmentation in the normal reduced gate-drive output voltage resulting from application of an appropriately scaled compensation voltage boost $V_{CHG}$ to Node A or to Node B (see FIG. 5).
Figure 9D:
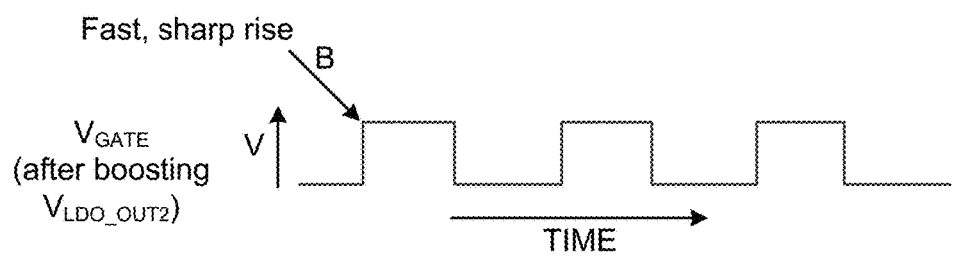
FIG. 9D is a graph of $V_{GATE}$ as a function of time with the benefit of a compensation voltage boost to $V_{LDO\_OUT2}$.

For example, FIG. 9A is a graph of $V_{GATE}$ as a function of time without the benefit of a compensation voltage boost. As arrow A indicates, the need to charge the relatively large gate capacitance of the power FET Mon leads to a relatively slow rise in $V_{GATE}$. FIG. 9B is a graph of $V_{GS\_SF}$ as a function of time, showing the periodic augmentation to the normal $2V_{GS}$ voltage that a compensation voltage boost $V_{CHG}$ provides if applied at Node A. FIG. 9C is a graph of $V_{LDO\_OUT2}$ as a function of time, showing the periodic augmentation in the normal reduced gate-drive output voltage resulting from application of an appropriately scaled compensation voltage boost $V_{CHG}$ to Node A or to Node B (see FIG. 5). FIG. 9D is a graph of $V_{GATE}$ as a function of time with the benefit of a compensation voltage boost to $V_{LDO\_OUT2}$. As arrow B indicates, the added compensation voltage boost $V_{CHG}$ compensates for the otherwise relatively slow rise in $V_{GATE}$, as shown in FIG. 9A, such that $V_{GATE}$ has a fast, sharp rise. After the compensation voltage boost $V_{CHG}$ times out, the reduced gate-drive to the power FET $M_{CP1}$ from the final inverter 204b, as powered by $V_{LDO\_OUT2}$ from the second LDO section 306, continues for the rest of a cycle.

Figure 10:
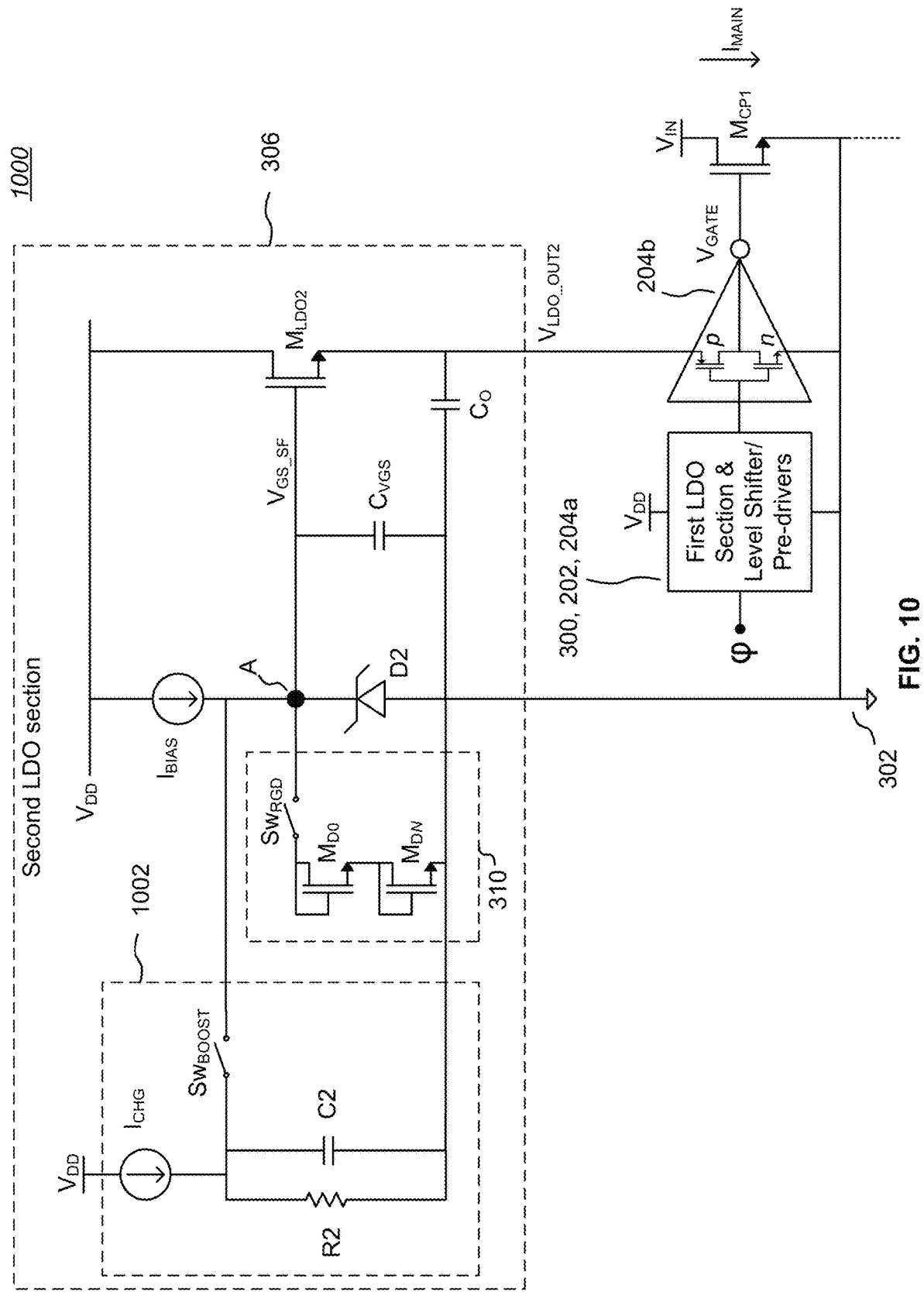
FIG. 10 is a block diagram of a third embodiment of an enhanced LDO power supply.

FIG. 10 is a block diagram of a third embodiment of an enhanced LDO power supply 1000. Similar in most aspects to the LDO power supply 206 of FIG. 3, the enhanced LDO power supply 1000 differs by including a calibrated compensation circuit 1002 coupled to Node A and configured to periodically boost the output voltage $V_{LDO\_OUT2}$ to the final inverter 204b. The calibrated compensation circuit 1002 includes a generally fixed current source $I_{CHG}$ coupled in series with an RC circuit (comprising a parallel resistor R2 and capacitor C2 in this example) between $V_{DD}$ and the floating reference potential 302. A switch $Sw_{BOOST}$ selectively couples the voltage across the resistor R2 and capacitor C2 to Node A.

In operation, the capacitor C2 is pre-charged to a level above the $2V_{GS}$ voltage provided by the voltage control circuit 310. The switch $Sw_{BOOST}$ is periodically closed for a short time when $V_{GATE}$ is rising (e.g., the state of switch $Sw_{BOOST}$ may be set or triggered by a control signal that tracks the state of the input φ to the level shifter, if present, and to the driver circuit 204). Closing switch $Sw_{BOOST}$ transfers charge from the capacitor C2 to capacitor $C_{VGS}$, and thus adds an additional voltage, $V_{CHG}$, to $V_{GS\_SF}$. The additional voltage $V_{CHG}$ applied to the gate of the source-follower FET $M_{LDO2}$ compensates (adds to) the charge that is transferred from the LDO capacitor $C_O$ to the gate capacitance of the power FET Mon very quickly when the power FET is ON. This charge transference makes the edges of $V_{GATE}$ sharper as shown in FIG. 9D and results in the current $I_{MAIN}$ through the power FET $M_{CP1}$ being substantially independent of frequency in the reduced gate-drive mode.

The amount of charge stored in capacitor C2 and the duration of the closed state for the switch $Sw_{BOOST}$ needed for a particular application may be fairly precisely determined by modeling the enhanced LDO power supply 1000, and in that sense the circuit is calibrated.

D. Example Compensation Circuit Coupled to Node B

Figure 11:
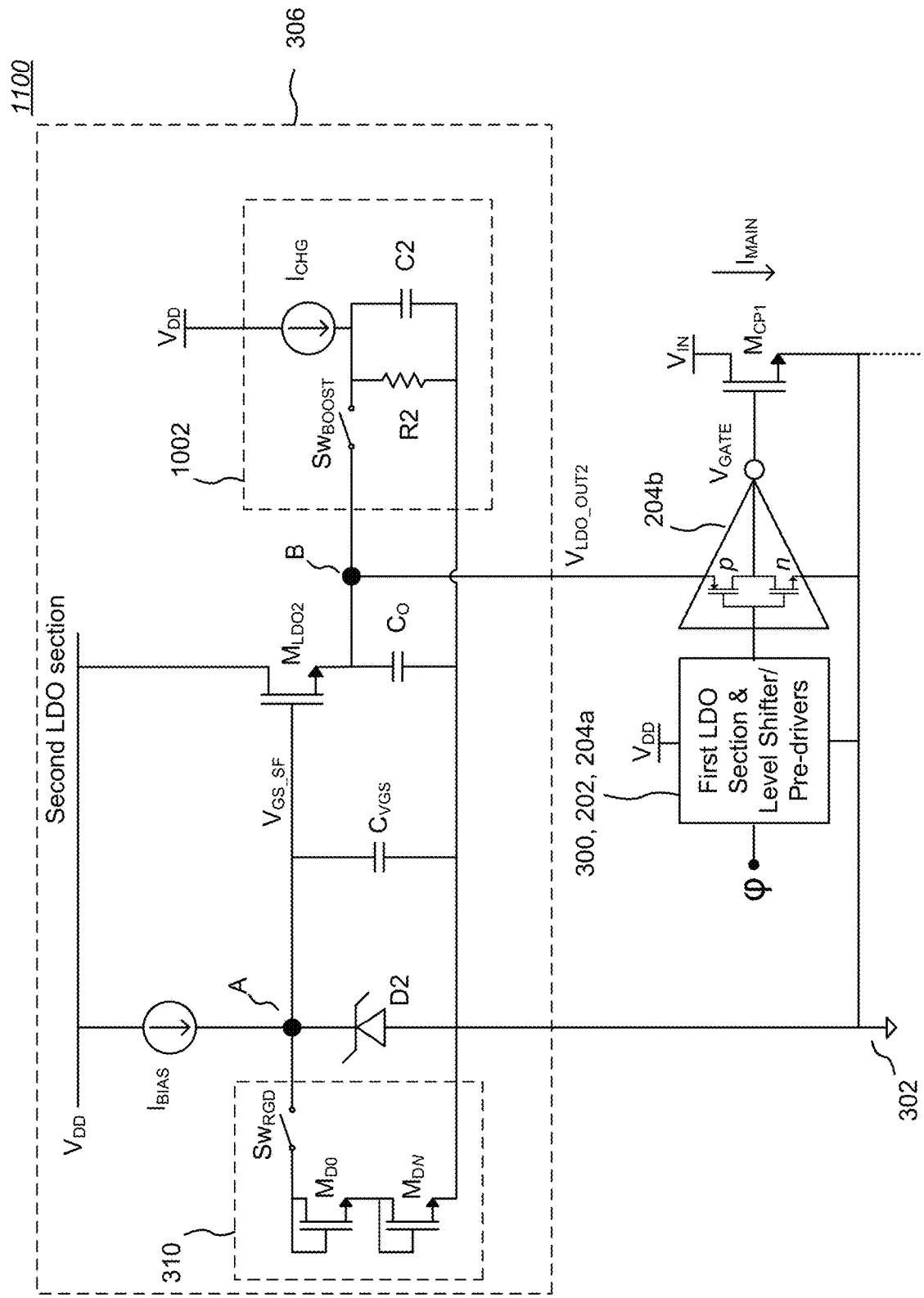
FIG. 11 is a block diagram of a fourth embodiment of an enhanced LDO power supply.

FIG. 11 is a block diagram of a fourth embodiment of an enhanced LDO power supply 1100. Similar in most aspects to the enhanced LDO power supply 1000 of FIG. 10, the enhanced LDO power supply 1100 differs by coupling the calibrated compensation circuit 1002 at Node B (which periodically boosts $V_{LDO\_OUT2}$) rather than at Node A (which periodically boosts the gate voltage $V_{GS\_SF}$ to the source-follower FET $M_{LDO2}$). Connecting the calibrated compensation circuit 1002 at node B allows $V_{LDO\_OUT2}$ to the final inverter 204b to be directly regulated so that $V_{GATE}$ is adjusted to provide a reduced gate-drive to the power FET $M_{CP1}$ that is substantially independent of frequency. Again, the amount of charge stored in capacitor C2 and the duration of the closed state for the switch $Sw_{BOOST}$ needed for a particular application may be fairly precisely determined by modeling the enhanced LDO power supply 1000, and in that sense the circuit is calibrated.

In a variant embodiment, capacitor C2 may be omitted, since the current source $I_{CHG}$ can periodically add charge through the switch $Sw_{BOOST}$ to the capacitor $C_O$ to compensate (add to) the charge that is transferred from the LDO capacitor $C_O$ to the gate capacitance of the power FET $M_{CP1}$.

E. Example Compensation Circuit Coupled to Node C

Figure 12:
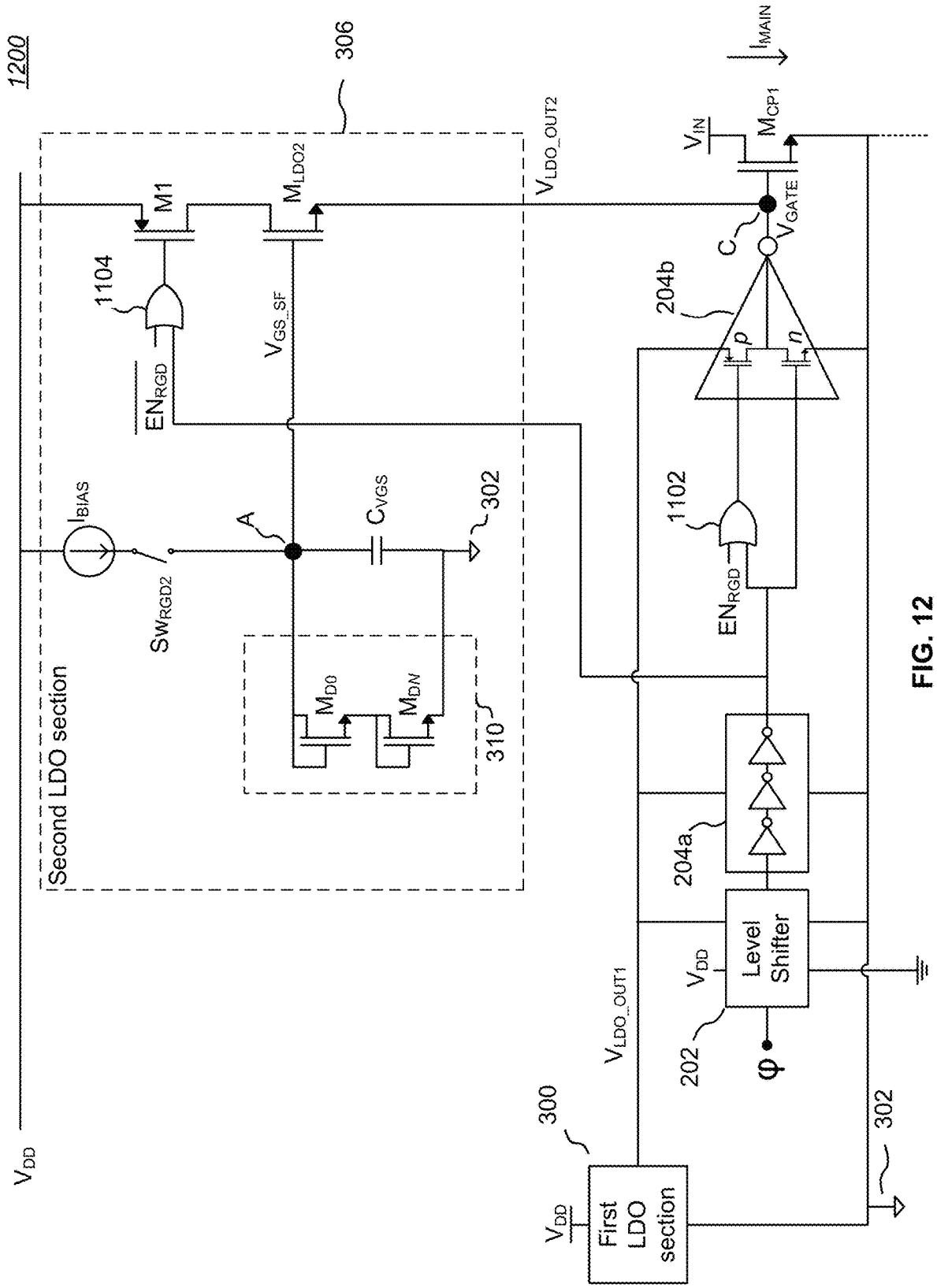
FIG. 12 is a block diagram of a fifth embodiment of an enhanced LDO power supply.

FIG. 12 is a block diagram of a fifth embodiment of an enhanced LDO power supply 1200. In essence, during the normal full gate-drive mode, the first LDO section 300 is enabled to provide $V_{GATE}$ to the power FET $M_{CP1}$ while the second LDO section 306 is disabled. Conversely, during the reduced gate-drive mode, the second LDO section 306 is enabled to provide $V_{GATE}$ to the power FET $M_{CP1}$ while the first LDO section 300 is disabled.

In the illustrated example, the first LDO section 300 provides $V_{LDO\_OUT1}$ to the level shifter 202, the pre-driver 204a, and the final driver 204b, and the output of the second LDO section 306 is coupled to Node C (i.e., to the gate of the power FET $M_{CP1}$). The final driver 204b is shown modified to provide the clock signal φ to the PMOS FET p in the final driver 204b through an OR gate 1102 only if a control signal, $EN_{RGD}$, is asserted with a LOW (logical 0) value.

The second LDO section 306 is configured similar to the enhanced LDO power supply 1000 of FIG. 10. However, the calibrated compensation circuit 1002 of FIG. 10 is omitted, the source of the source-follower FET $M_{LDO2}$ is connected to Node C, and power to the source-follower FET $M_{LDO2}$ is controlled by a PFET M1 coupled between $V_{DD}$ and the drain of the source-follower FET $M_{LDO2}$. The ON or OFF state of FET M1 is controlled by an OR gate 1104 to which is coupled a control signal $\overline{EN_{RGD}}$ (the complement of the $EN_{RGD}$ control signal to the OR gate 1102) and the output of the pre-driver 204a. Further, the voltage control circuit 310 is modified to omit the switch $Sw_{RGD}$ of FIG. 10 (not needed since the entire second LDO section 306 is only operational during the reduced gate-drive mode) and the diode D2 and capacitor $C_O$ shown in FIG. 10 are omitted (not needed since the entire second LDO section 306 is only operational during the reduced gate-drive mode and there is a direct connection to Node C). Lastly, an optional switch $Sw_{RGD2}$ is interposed between Noda A and the current source $I_{BIAS}$, and may be opened to disable the voltage control circuit 310 (alternatively, the PFET M1 may be disabled using the $\overline{EN_{RGD}}$ control signal, allowing the switch $Sw_{RGD2}$ to be omitted).

In full gate-drive mode, the control signal $EN_{RGD}$ has a LOW (logical 0) value. Accordingly, PFET M1 is set to an OFF state by the complementary control signal $\overline{EN_{RGD}}$ and coupling of the clock signal φ through the OR gate 1102 to the PMOS FET p in the final driver 204b is enabled. In addition, the switch $Sw_{RGD2}$ is opened. Thus, the first LDO section 300 is enabled and the second LDO section 306 is disabled.

In reduced gate-drive mode, the control signal $EN_{RGD}$ has a HIGH (logical 1) value. Accordingly, PFET M1 is set to an ON state by the complementary control signal $\overline{EN_{RGD}}$ and coupling of the clock signal φ through the OR gate 1104, PFET M1, and source-follower FET $M_{LDO2}$ to the gate of the power FET $M_{CP1}$ is enabled. In addition, the switch $Sw_{RGD2}$ is closed. Thus, the first LDO section 300 is disabled and the second LDO section 306 is enabled. The value of $V_{GS\_SF}$ is set by the voltage control circuit 310 to $2V_{GS}$ and sets $V_{GATE}$ when the power FET $M_{CP1}$ is ON to a targeted reduced gate-drive level.

The embodiment of FIG. 12 has an advantage that it provides an additional boost to $V_{GS\_SF}$ through PFET M1 and the gate-drain capacitance $C_{GD}$ of $M_{LDO2}$ without extra circuitry while the power FET $M_{CP1}$ turns ON. When PFET M1 is ON, then the drain of $M_{LDO2}$ is pulled up to $V_{DD}$. The $C_{GD}$ capacitance of $M_{LDO2}$ couples the rise in charge at the drain of $M_{LDO2}$ to $V_{GS\_SF}$ for a short duration, which provides additional charge to the gate of the power FET $M_{CP1}$.

Alternative Embodiments

It should be appreciated that both feedback and compensation circuits may be used together. For example, in some applications, it may be useful to combine the closed-loop direct supplementation of $V_{GS\_SF}$ as shown in FIG. 6A or FIG. 8 with the compensation circuit 1002 shown in FIG. 10 (Node A connected) or FIG. 11 (Node B connected).

Further, while the embodiments of this disclosure have focused on the use of a source-follower FET $M_{LDO2}$, alternative embodiments may use any circuit (e.g., an op amp, OTA, etc.) that provides a reduced gate drive voltage to the final inverter 204b or to the gate of the power FET $M_{CP1}$ in response to a change in a reference voltage.

Figure 13:
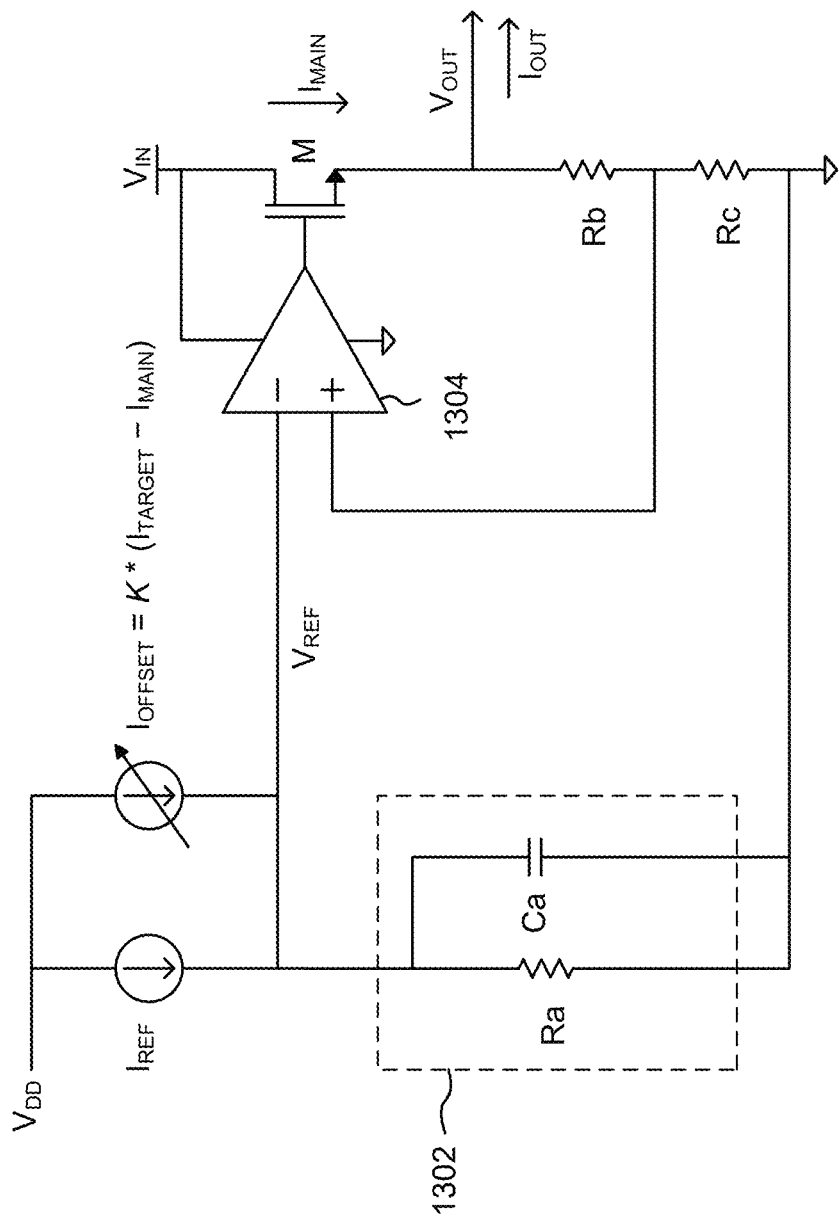
FIG. 13 is a schematic diagram of an LDO.

Embodiments of the invention may also be used to accurately limit startup currents in buck/boost power converters and LDO power supplies in general. For example, FIG. 13 is a schematic diagram of an LDO 1300. A current source $I_{REF}$ is coupled in series with an RC circuit 1302 (comprising a parallel resistor Ra and capacitor Ca) between $V_{DD}$ and a floating reference potential. A variable current source $I_{OFFSET}$ is coupled between $V_{DD}$ and the RC circuit 1302. The current source $I_{OFFSET}$ may be implemented as described in FIGS. 6A and 7A-7C. The current from $I_{REF}$ and $I_{OFFSET}$ when applied across the RC circuit 1302 generates a voltage $V_{REF}$, which is coupled to a first input of a differential amplifier 1304. The output of the differential amplifier 1304 is coupled to the gate of a power FET M. The conduction channel of FET M is coupled in series with resistors Rb and Rc between $V_{IN}$ and the floating reference potential. A feedback voltage from between resistors Rb and Rc is coupled to a second input of the differential amplifier 1304. In operation, the current source $I_{OFFSET}$ adjusts the current across the RC circuit 1302 that generates $V_{REF}$ as a function of the difference between $I_{TARGET}$ and $I_{MAIN}$ until the difference is essentially eliminated.

Benefits

Embodiments of the present invention may some or all of the following advantages: a current limiting value that is independent of a power converter switching frequency, device mismatches and process, voltage, and/or temperature (PVT) variations; accurate soft-start current limiting; reliable operation of power FETs in power converters having reconfigurable conversion ratios when dynamically changing conversion ratios; and the ability to keep a level output voltage when a power converter operates at full load in different operating and PVT conditions.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 14:
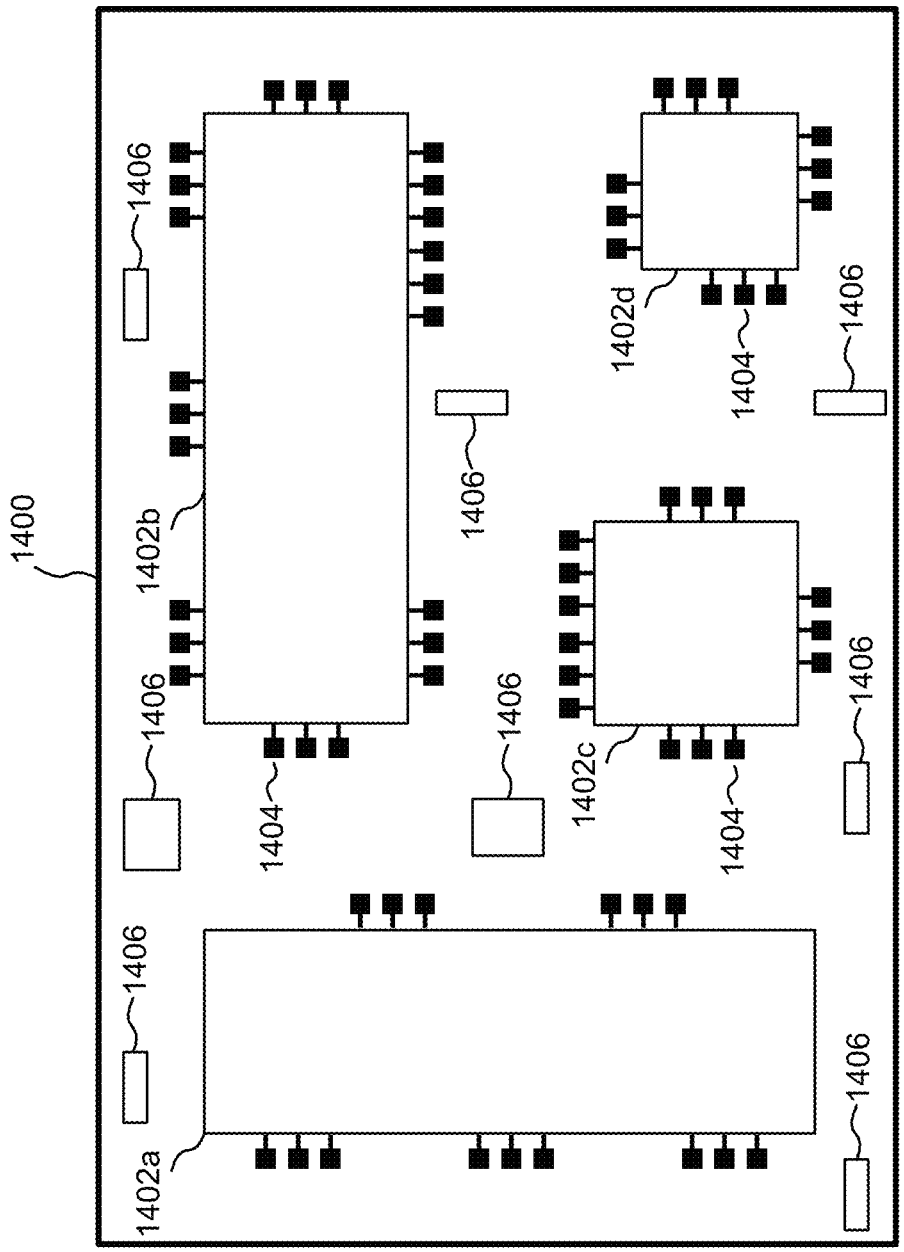
FIG. 14 is a top plan view of a substrate that may be, for example, a printed circuit board or chip module substrate (e.g., a thin-film tile).

As one example of further integration of embodiments of the present invention with other components, FIG. 14 is a top plan view of a substrate 1400 that may be, for example, a printed circuit board or chip module substrate (e.g., a thin-film tile). In the illustrated example, the substrate 1400 includes multiple ICs 1402a-1402d having terminal pads 1404 which would be interconnected by conductive vias and/or traces on and/or within the substrate 1400 or on the opposite (back) surface of the substrate 1400 (to avoid clutter, the surface conductive traces are not shown and not all terminal pads are labelled). The ICs 1402a-1402d may embody, for example, signal switches, active filters, amplifiers (including one or more LNAs), and other circuitry. For example, IC 1402b may incorporate one or more instances of an enhanced LDO power supply circuit like the circuits shown in FIGS. 6A, 8, 10, 11, and/or 12.

The substrate 1400 may also include one or more passive devices 1406 embedded in, formed on, and/or affixed to the substrate 1400. While shown as generic rectangles, the passive devices 1406 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 1400 to other passive devices 1406 and/or the individual ICs 1402a-1402d. The front or back surface of the substrate 1400 may be used as a location for the formation of other structures.

System Aspects

Embodiments of the present invention are useful in a wide variety of applications, including portable computing devices (e.g., laptops, notebooks, cell phones, tablets), datacenters and telecom centers that have battery backup systems, household appliances and electronics, vehicles (e.g., automobiles, drones, planes, boats, trains, ships), general purpose DC/DC and AC/DC power converters, and radio frequency (RF) circuits and systems.

Radio system usage may include wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Methods

Figure 15:
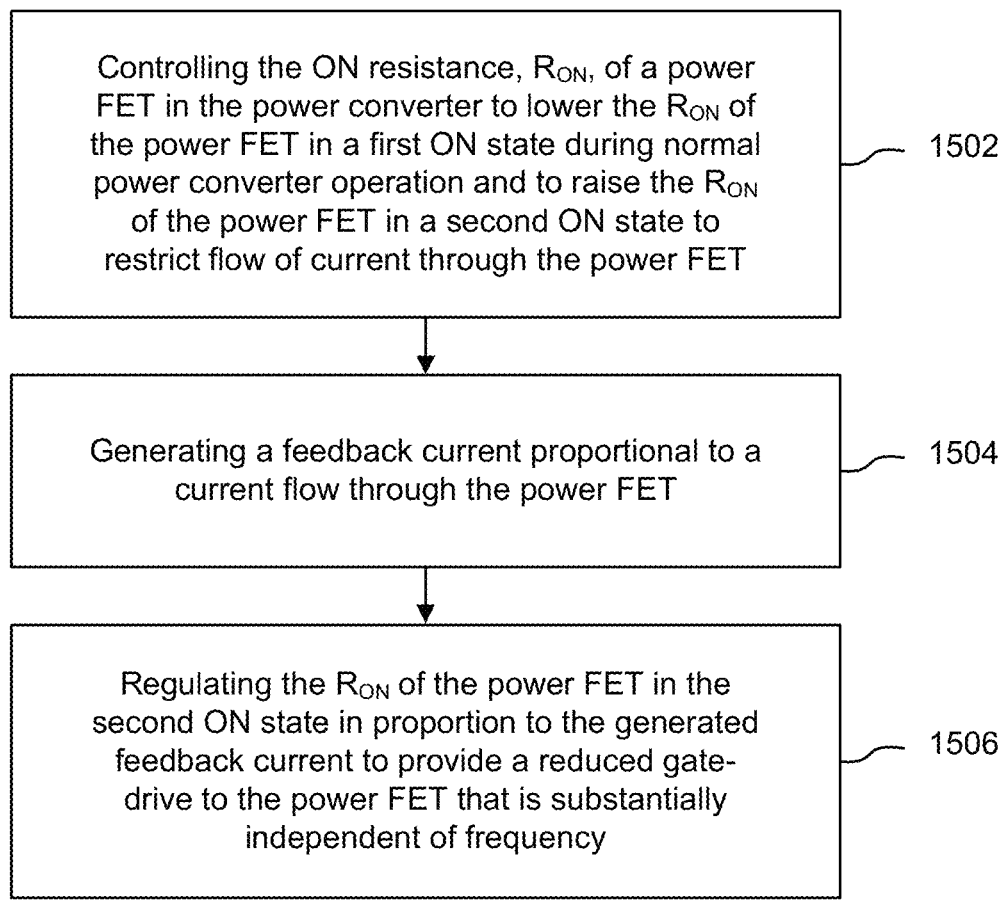
FIG. 15 is a process flow chart showing a first method for protecting a power converter.

Another aspect of the invention includes methods for protecting a power converter. For example, FIG. 15 is a process flow chart 1500 showing a first method for protecting a power converter. The method includes: controlling the ON resistance, $R_{ON}$, of a power FET in the power converter to lower the $R_{ON}$ of the power FET in a first ON state during normal power converter operation and to raise the $R_{ON}$ of the power FET in a second ON state to restrict flow of current through the power FET (Block 1502); generating a feedback current proportional to a current flow through the power FET (Block 1504); and regulating the $R_{ON}$ of the power FET in the second ON state in proportion to the generated feedback current to provide a reduced gate-drive to the power FET that is substantially independent of frequency (Block 1506).

Additional aspects of the above method may include one or more of the following: regulating the RON of the power FET in the second ON state in proportion to the generated feedback current during a dynamic re-configuration of a conversion ratio of the power converter; regulating the RON of the power FET in the second ON state in proportion to the generated feedback current during a startup period of the power converter; and/or regulating the RON of the power FET in the second ON state in proportion to the generated feedback current during a charge re-balancing event among two or more capacitors within the power converter.

As another example, FIG. 16 is a process flow chart 1600 showing a second method for protecting a power converter. The method includes: controlling the ON resistance, $R_{ON}$, of a power FET in the power converter to lower the $R_{ON}$ of the power FET in a first ON state during normal power converter operation and to raise the $R_{ON}$ of the power FET in a second ON state to restrict flow of current through the power FET (Block 1602); and applying a compensation voltage boost to a gate of the power FET in the second ON state to increase a drive voltage to the gate to compensate for a gate capacitance of the power FET (Block 1604).

Additional aspects of the above method may include one or more of the following: applying the compensation voltage boost during a dynamic re-configuration of a conversion ratio of the power converter; applying the compensation voltage boost during a startup period of the power converter; and/or applying the compensation voltage boost during a charge re-balancing event among two or more capacitors within the power converter.

Figure 17:
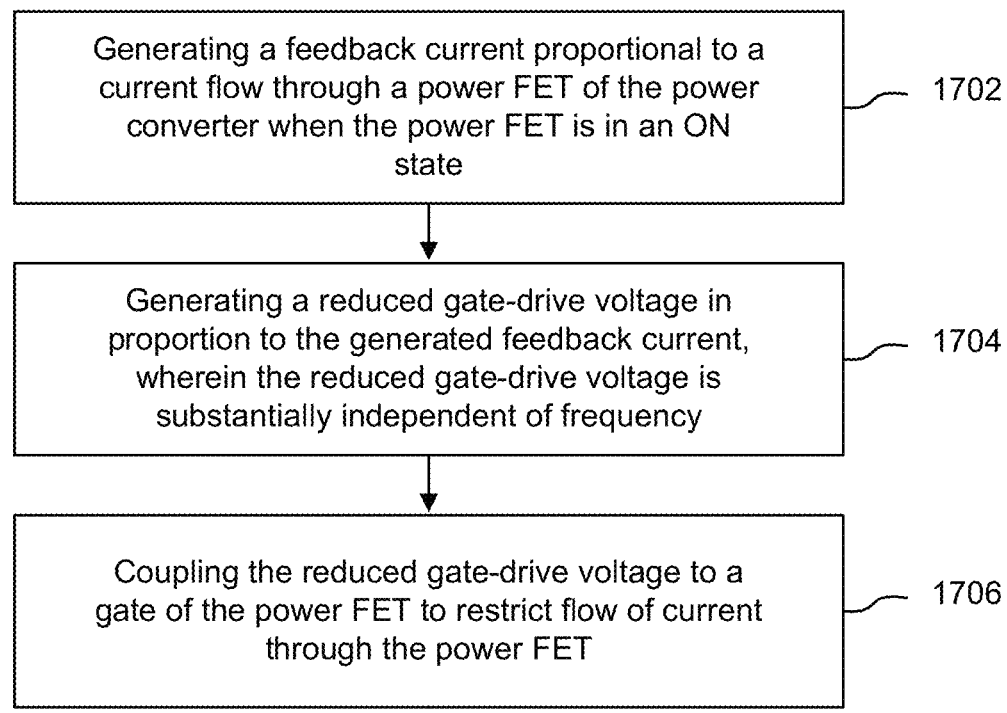
FIG. 17 is a process flow chart showing a third method for protecting a power converter.

As yet another example, FIG. 17 is a process flow chart 1700 showing a third method for protecting a power converter. The method includes: generating a feedback current proportional to a current flow through a power FET of the power converter when the power FET is in an ON state (Block 1702); generating a reduced gate-drive voltage in proportion to the generated feedback current, wherein the reduced gate-drive voltage is substantially independent of frequency (Block 1704); and coupling the reduced gate-drive voltage to a gate of the power FET to restrict flow of current through the power FET (Block 1706).

Additional aspects of the above method may include one or more of the following: generating the reduced gate-drive voltage during a dynamic re-configuration of a conversion ratio of the power converter; generating the reduced gate-drive voltage during a startup period of the power converter; generating the reduced gate-drive voltage during a charge re-balancing event among two or more capacitors within the power converter; wherein the reduced gate-drive voltage increases an ON resistance, $R_{ON}$, of the power FET; and/or wherein the reduced gate-drive voltage causes the power FET to function as a controlled current-limited source when the power FET is in a saturation mode of operation.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A gate control circuit for regulating a gate-drive voltage to a gate of a power FET, including:
   (a) a source-follower circuit including a source-follower FET having a conduction channel configured to be coupled to the gate of the power FET, the gate control circuit configured to selectively apply at least a first gate-drive voltage or a second gate-drive voltage to the gate of the power FET such that a current flow through the power FET in an ON state is limited when the second gate-drive voltage is applied; and
   (b) a feedback circuit coupled to a gate of the source-follower FET and configured to generate a feedback signal as a function of the current flow through the power FET and to regulate the second gate-drive voltage as a function of the generated feedback signal.

2. The invention of claim 1, wherein the second gate-drive voltage is substantially independent of frequency.

3. The invention of claim 1, wherein the power FET is a component of a power converter, and the gate control circuit applies the second gate-drive voltage to the gate of the power FET during a dynamic re-configuration of a conversion ratio of the power converter.

4. The invention of claim 1, wherein the power FET is a component of a power converter, and the gate control circuit applies the second gate-drive voltage to the gate of the power FET during a startup period of the power converter.

5. The invention of claim 1, wherein the power FET is a component of a power converter, and the gate control circuit applies the second gate-drive voltage to the gate of the power FET during a charge re-balancing event among two or more capacitors within the power converter.

6. The invention of claim 1, wherein the feedback circuit includes:
   (a) a current to voltage converter configured to output a voltage proportional to the current flow through the power FET;
   (b) a filter having an input coupled to the output of the current to voltage converter, and an output;
   (c) an amplifier coupled to the output of the filter and to a reference voltage, the amplifier configured to output the feedback current.

7. The invention of claim 1, the source-follower circuit further includes:
   (a) a current source coupled between a voltage source and a gate of the source-follower FET;
   (b) a voltage regulator coupled to the gate of the source-follower FET and configured to provide a voltage; and
   (c) a voltage control circuit coupled to the gate of the source-follower FET and including a first selectable configuration disconnected from the gate of the source-follower FET, and a second selectable configuration coupled to the gate of the source-follower FET, wherein the voltage at the gate of the source-follower FET when the voltage control circuit is in the first selectable configuration is higher than in the second selectable configuration.

8. The invention of claim 7, wherein the voltage control circuit includes:
   (a) a switch;
   (b) a first diode-connected FET; and
   (c) at least one additional diode-connected FET;
      wherein the switch, the first diode-connected FET, and the at least one additional diode-connected FET are coupled in series between the gate of the source-follower FET and a reference potential.

9. The invention of claim 7, wherein the voltage regulator is a Zener diode.

10. A gate control circuit for controlling the ON resistance, $R_{ON}$, of a power FET in a power converter, including:
    (a) a source-follower circuit including a source-follower FET having a conduction channel configured to be coupled to the gate of the power FET, the gate control circuit configured to lower the $R_{ON}$ of the power FET in a first ON state during normal power converter operation and to raise the $R_{ON}$ of the power FET in a second ON state to restrict flow of current through the power FET; and
    (b) a feedback circuit coupled to a gate of the source-follower FET and configured to generate a feedback current proportional to a current flow through the power FET and to regulate the $R_{ON}$ of the power FET in the second ON state in proportion to the generated feedback current to provide a reduced gate-drive to the power FET.

11. The invention of claim 10, wherein the reduced gate-drive to the power FET is substantially independent of frequency.

12. The invention of claim 10, wherein the gate control circuit raises the $R_{ON}$ of the power FET in the second ON state during a re-configuration of a conversion ratio of the power converter.

13. The invention of claim 10, wherein the gate control circuit raises the $R_{ON}$ of the power FET in the second ON state during a startup period of the power converter.

14. The invention of claim 10, wherein the gate control circuit raises the $R_{ON}$ of the power FET in the second ON state during a charge re-balancing event among two or more capacitors within the power converter.

15. The invention of claim 10, wherein the feedback circuit includes:
    (a) a current to voltage converter configured to output a voltage proportional to the current flow through the power FET;
    (b) a filter having an input coupled to the output of the current to voltage converter, and an output;

(c) an amplifier coupled to the output of the filter and to a reference voltage, the amplifier configured to output the feedback current.

16. The invention of claim 10, wherein and the source-follower circuit further includes:
    (a) a current source coupled between a voltage source and a gate of the source-follower FET;
    (b) a voltage regulator coupled to the gate of the source-follower FET and configured to provide a voltage; and
    (c) a voltage control circuit coupled to the gate of the source-follower FET and including a first selectable configuration disconnected from the gate of the source-follower FET, and a second selectable configuration coupled to the gate of the source-follower FET, wherein the voltage at the gate of the source-follower FET when the voltage control circuit is in the first selectable configuration is higher than in the second selectable configuration.

17. The invention of claim 16, wherein the voltage control circuit includes:
    (a) a switch;
    (b) a first diode-connected FET; and
    (c) at least one additional diode-connected FET;
        wherein the switch, the first diode-connected FET, and the at least one additional diode-connected FET are coupled in series between the gate of the source-follower FET and a reference potential.

18. The invention of claim 16, wherein the voltage regulator is a Zener diode.

\* \* \* \* \*